United States Patent
Mangnus et al.

(10) Patent No.: US 12,394,589 B2
(45) Date of Patent: Aug. 19, 2025

(54) CHARGED PARTICLE DEVICE, DETECTOR, AND METHODS

(71) Applicant: ASML NETHERLANDS B.V., Veldhoven (NL)

(72) Inventors: Albertus Victor Gerardus Mangnus, Eindhoven (NL); Erwin Slot, Zoetermeer (NL)

(73) Assignee: ASML NETHERLANDS B.V., Veldhoven (NL)

( * ) Notice: Subject to any disclaimer, the term of this patent is extended or adjusted under 35 U.S.C. 154(b) by 427 days.

(21) Appl. No.: 17/856,722

(22) Filed: Jul. 1, 2022

(65) Prior Publication Data

US 2023/0005706 A1    Jan. 5, 2023

(30) Foreign Application Priority Data

Jul. 5, 2021  (EP) .................................. 21183811

(51) Int. Cl.
*H01J 37/244* (2006.01)
*H01J 37/145* (2006.01)
*H01J 37/28* (2006.01)

(52) U.S. Cl.
CPC .......... *H01J 37/244* (2013.01); *H01J 37/145* (2013.01); *H01J 37/28* (2013.01); *H01J 2237/2446* (2013.01); *H01J 2237/24475* (2013.01); *H01J 2237/2448* (2013.01)

(58) Field of Classification Search
CPC ........ H01J 37/244; H01J 37/145; H01J 37/28; H01J 2237/2446; H01J 2237/24475; H01J 2237/2448; H01J 2237/2441; H01J 2237/24465; H01J 2237/2804; H01J 2237/2806

See application file for complete search history.

(56) References Cited

U.S. PATENT DOCUMENTS

| | | | | |
|---|---|---|---|---|
| 2,738,431 A | * | 3/1956 | Herzog | H01J 47/08 250/386 |
| 4,785,186 A | * | 11/1988 | Street | G01T 1/242 257/E31.089 |
| 5,973,323 A | * | 10/1999 | Adler | H01J 37/285 250/307 |

(Continued)

FOREIGN PATENT DOCUMENTS

| | | |
|---|---|---|
| EP | 0872873 | 10/1998 |
| EP | 3863040 | 8/2021 |

(Continued)

OTHER PUBLICATIONS

Office Action issued in the corresponding Taiwanese Patent Application No. 111124693, dated Apr. 13, 2023.

(Continued)

*Primary Examiner* — David A Vanore
(74) *Attorney, Agent, or Firm* — Pillsbury Winthrop Shaw Pittman, LLP

(57) ABSTRACT

A detector for use in a charged particle device for an assessment tool to detect signal particles from a sample, the detector including a substrate, the substrate including: a semiconductor element configured to detect signal particles above a first energy threshold; and a charge-based element configured to detect signal particles below a second energy threshold.

20 Claims, 15 Drawing Sheets

(56) References Cited

U.S. PATENT DOCUMENTS

| | | | |
|---|---|---|---|
| 6,204,087 B1* | 3/2001 | Parker | H01L 31/0352 |
| | | | 257/E27.129 |
| 7,714,300 B1* | 5/2010 | McCord | H01J 37/244 |
| | | | 250/397 |
| 10,466,212 B2 | 11/2019 | Brown et al. | |
| 11,054,753 B1 | 7/2021 | Kaplan et al. | |
| 11,222,766 B2* | 1/2022 | Wang | H01J 37/28 |
| 11,821,859 B2 | 11/2023 | Wieland et al. | |
| 2005/0224707 A1* | 10/2005 | Guedj | H01L 31/103 |
| | | | 257/E27.141 |
| 2006/0151711 A1* | 7/2006 | Frosien | H01J 37/28 |
| | | | 250/396 ML |
| 2010/0276606 A1 | 11/2010 | Baars et al. | |
| 2012/0175527 A1* | 7/2012 | De Boer | H01J 37/185 |
| | | | 250/492.1 |
| 2012/0298864 A1* | 11/2012 | Morishita | H01J 37/244 |
| | | | 250/310 |
| 2014/0361168 A1 | 12/2014 | Ogawa et al. | |
| 2016/0203947 A1 | 7/2016 | Aoki et al. | |
| 2019/0259564 A1 | 8/2019 | Kruit et al. | |
| 2019/0259570 A1 | 8/2019 | Kruit et al. | |
| 2019/0378682 A1* | 12/2019 | Wang | H01L 31/085 |
| 2020/0118784 A1 | 4/2020 | Jiang et al. | |
| 2020/0203116 A1 | 6/2020 | Winkler et al. | |
| 2020/0227229 A1* | 7/2020 | Wang | H01L 27/14609 |
| 2020/0273664 A1 | 8/2020 | Wang et al. | |
| 2021/0116398 A1* | 4/2021 | Ren | H01J 37/244 |
| 2021/0134557 A1 | 5/2021 | Wang et al. | |
| 2021/0319977 A1* | 10/2021 | Liu | H01J 37/244 |
| 2022/0196581 A1* | 6/2022 | Wieland | G01N 23/2251 |
| 2022/0415611 A1* | 12/2022 | Steenbrink | H01J 37/141 |
| 2023/0005706 A1* | 1/2023 | Mangnus | H01J 37/145 |
| 2023/0137186 A1* | 5/2023 | Ren | H01J 37/244 |
| | | | 250/306 |
| 2023/0324318 A1* | 10/2023 | Ren | G01N 23/2251 |
| | | | 250/252.1 |
| 2024/0128043 A1* | 4/2024 | Van Soest | H01J 37/12 |
| 2024/0128045 A1* | 4/2024 | Slot | H01J 37/28 |
| 2024/0272312 A1* | 8/2024 | Mangnus | G01T 1/20182 |

FOREIGN PATENT DOCUMENTS

| | | |
|---|---|---|
| EP | 3937205 | 1/2022 |
| EP | 4002421 | 5/2022 |
| EP | 4020516 | 6/2022 |
| EP | 4020518 | 6/2022 |
| EP | 4020565 | 6/2022 |
| TW | 201633357 | 9/2016 |
| TW | 201942940 | 11/2019 |
| TW | 202101515 | 1/2021 |
| WO | 2004081910 | 9/2004 |
| WO | 2010125526 | 11/2010 |
| WO | 2012148267 | 11/2012 |
| WO | 2012165955 | 12/2012 |
| WO | 2016077047 | 5/2016 |
| WO | 2020135963 | 7/2020 |
| WO | 2021204740 | 10/2021 |
| WO | 2022008462 | 1/2022 |
| WO | 2022/136064 | 6/2022 |

OTHER PUBLICATIONS

International Search Report dated Nov. 29, 2022, issued in the corresponding International Application No. PCT/EP2022/067788, pp. 1-2.

* cited by examiner

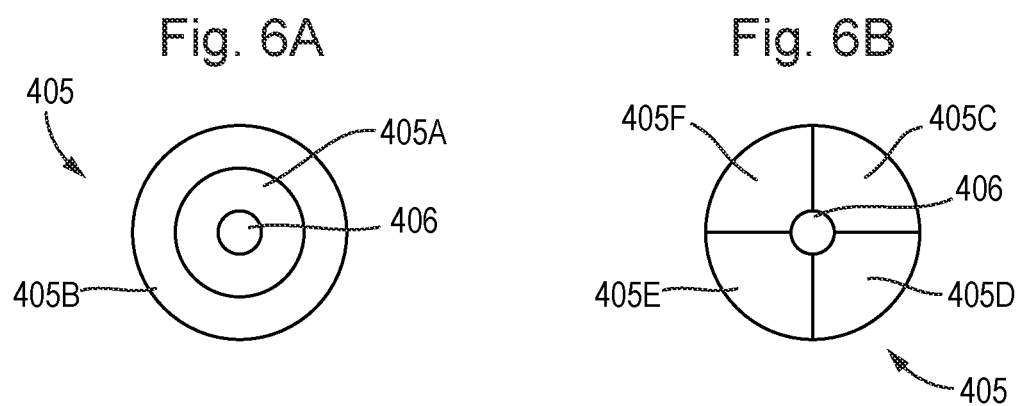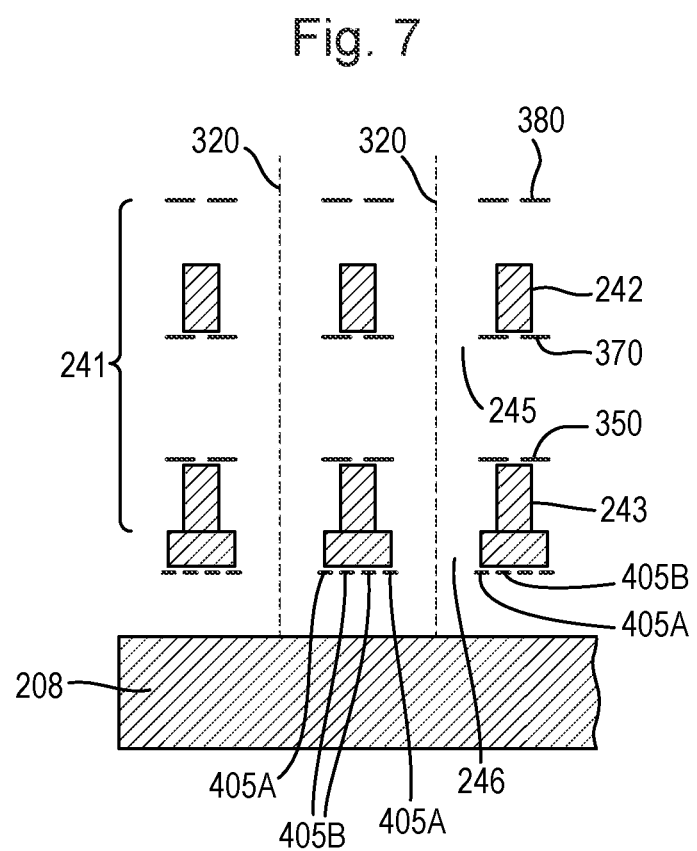

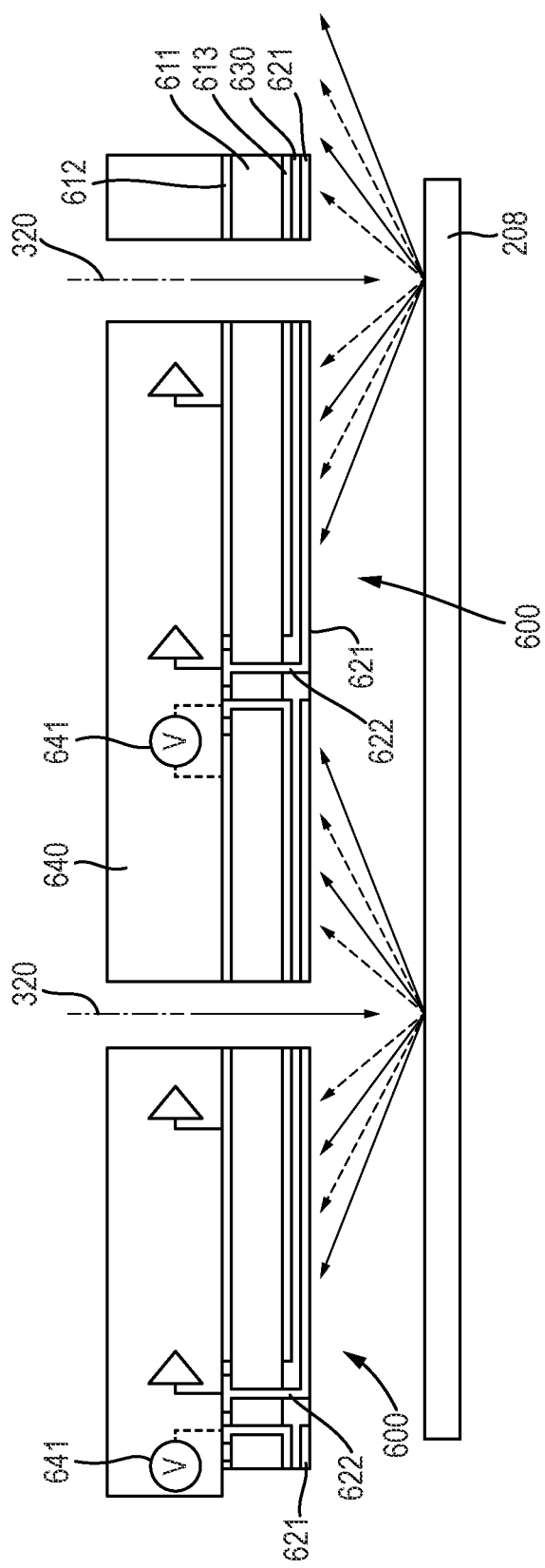

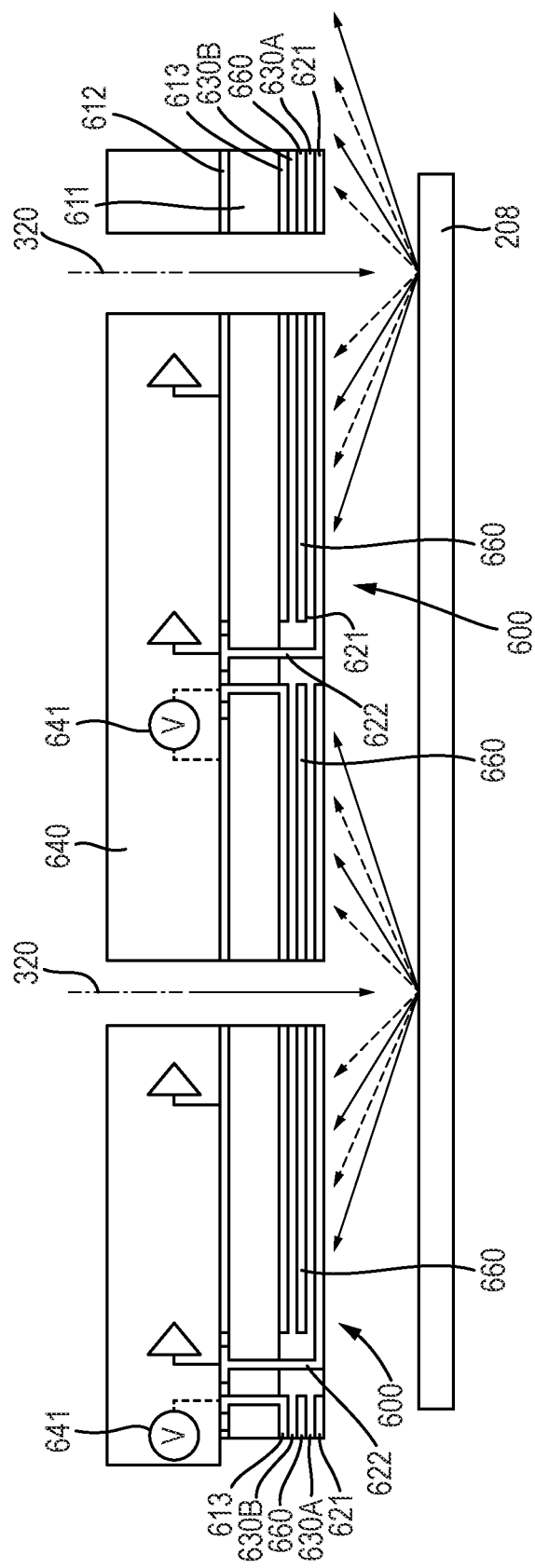

1

CHARGED PARTICLE DEVICE, DETECTOR, AND METHODS

This application claims the benefit of priority to European patent application no. 21183811.5, filed Jul. 5, 2021, which is incorporated herein in its entirety by reference.

FIELD

The disclosure herein generally relates to charged-particle devices, detectors, and methods.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain data representing characteristics of the material structure of the surface of the sample. The data may be referred to as an image and may be rendered into an image.

SUMMARY

Although the data obtained in this way can be useful, there are limitations in the information obtained about the sample from such known electron microscopy techniques. In general, there is a need to obtain additional or alternative information, for example, relating to structures below the surface of the sample and relating to overlay targets.

It is an object of the present disclosure to provide, for example, embodiments that support obtaining information from a sample using charged particles, for example, using backscattered and/or secondary signal particles.

According to an aspect, there is provided a detector for use in a charged particle device for an assessment tool, the charged particle device configured to project a beam of charged particles to a sample and the detector to detect resulting signal particles from the sample, the detector comprising a substrate, the substrate comprising: a semiconductor element configured to detect signal particles above a first energy threshold; and a charge-based element configured to detect signal particles below a second energy threshold, the charge-based element being configured to electrically connect the charge-based element for applying a biasing voltage, wherein the charge-based element and the semiconductor element are each at least part of layers that are substantially co-planar with major surfaces of the detector and the layers are comprised in a stacked structure comprised in the detector stacked in a thickness direction of the detector.

According to an aspect, there is provided a detector for use in a charged particle device for an assessment tool, the charged particle device configured to project a beam of charged particles to a sample and the detector to detect resulting signal particles from the sample, the detector comprising a substrate, the substrate comprising: a semiconductor element configured to detect signal particles above a first energy threshold; a charge-based element configured to detect signal particles below a second energy threshold, the charge-based element being configured to electrically connect the charge-based element; and an electrically insulated via configured to connect the charge-based element to detector circuitry wherein the electrically insulated via extends through at least part of the semiconductor element.

According to an aspect, there is provided a method of projecting a beam of charged particles onto a sample so as to detect resulting signal particles emitted from the sample, the method comprising: projecting the beam along a primary beam path onto a surface of the sample; and detecting the resulting signal particles emitted from the sample at a detector, the detector being proximate the sample and comprising a semiconductor element, the detecting comprising simultaneous detection of signal particles above a first energy threshold at a first detector element and signal particles below a second energy threshold at a second detector element.

According to an aspect, there is provided a detector for use in a charged particle device for an assessment tool to detect signal particles from a sample, the detector comprising a substrate, the substrate comprising: a semiconductor element configured to detect signal particles above a first energy threshold; and a charge-based element configured to detect signal particles below a second energy threshold.

According to an aspect, there is provided a detector array comprising a plurality of detectors described in an aspect above, wherein the detectors are comprised in a common substrate, each detector corresponding to a respective sub-beam.

According to an aspect, there is provided a detector array for use in a multi-beam charged particle device for an assessment tool to detect signal particles from a sample, the detector array comprising at least one substrate in which is defined a plurality of apertures for the passage therethrough of the plurality of sub-beams of charged particle beams towards a sample, the substrate comprising: a plurality of semiconductor elements configured to detect signal particles above a first energy threshold; and a plurality of charge-based elements configured to detect signal particles below a second energy threshold, wherein each semiconductor element is associated with a corresponding one of the charge-based elements.

According to an aspect, there is provided charged particle device for an assessment tool to detect signal particles from a sample, the device comprising: an objective lens configured to project a beam of charged particles onto a sample; and a detector described in an aspect above.

According to an aspect, there is provided a charged particle device for an assessment tool to detect signal particles from a sample, the device comprising: an objective lens array configured to project a plurality of sub-beams of charged particles onto a sample in a multi-beam array, and in which an aperture is defined for each sub-beam; and a detector system comprising at least one detector array described in an aspect above, wherein the apertures of the at least one detector array are aligned with the apertures defined in the objective lens array.

According to an aspect, there is provided charged particle device for an assessment tool to detect charged particles from a sample, the device comprising: an objective lens configured to project a beam of charged particles onto a sample, and in which an aperture is defined for the beam; and a detector proximate the sample and defining an aperture aligned with the aperture of the objective lens, the detector comprising a first detector element configured to detect signal particles above a first energy threshold and a second detector element configured to detect signal particles below a second energy threshold simultaneously, wherein the detector comprises a semiconductor element.

According to an aspect, there is provided a method of projecting a beam of charged particles onto a sample so as to detect signal particles emitted from the sample, the method comprising: projecting the beam along a primary beam path onto a surface of the sample; and detecting the signal particles emitted from the sample simultaneously at a semiconductor element and at a charge-based element.

According to an aspect, there is provided method of projecting a beam of charged particles onto a sample so as to detect signal particles emitted from the sample, the method comprising: projecting the beam along a primary beam path onto a surface of the sample; and detecting the signal particles emitted from the sample at a detector, the detector being proximate the sample and comprising a semiconductor element, the detecting comprising simultaneous detection of signal particles above a first energy threshold at a first detector element and signal particles below a second energy threshold at a second detector element.

According to an aspect, there is provided a method of projecting a plurality of sub-beams of charged particles onto a sample so as to detect signal particles emitted from the sample, the method comprising: projecting the sub-beams along primary sub-beam paths onto a surface of the sample; and detecting the signal particles emitted from the sample at a detector array, the detector array being proximate the sample and comprising a detector comprising a semiconductor element corresponding to each sub-beam, the detector comprising a first detector element and a second detector element, the detecting comprising simultaneous detection by each detector of signal particles above a first energy threshold at the corresponding first detector element and signal particles below a second energy threshold at the second detector element.

According to an aspect, there is provided a method of projecting a beam of charged particles onto a sample so as to detect signal particles emitted from the sample, the method comprising: providing a device according to an aspect above; projecting a beam of charged particles to the sample using the objective lens; and detecting the resulting signal particles simultaneously using the semiconductor element and the charge-based element.

BRIEF DESCRIPTION OF FIGURES

The above and other aspects of the present disclosure will become more apparent from the description of exemplary embodiments, taken in conjunction with the accompanying drawings.

FIG. 6A and FIG. 6B show a bottom view of variations of a detector.

FIG. 7 is a schematic cross-sectional view of an objective lens comprising detectors located in various positions along a beam path.

FIG. 17 is a cross-section of a detector array according to an embodiment.

FIG. 18 is a cross-section of a detector array according to a variation of FIG. 17.

Figure 1:
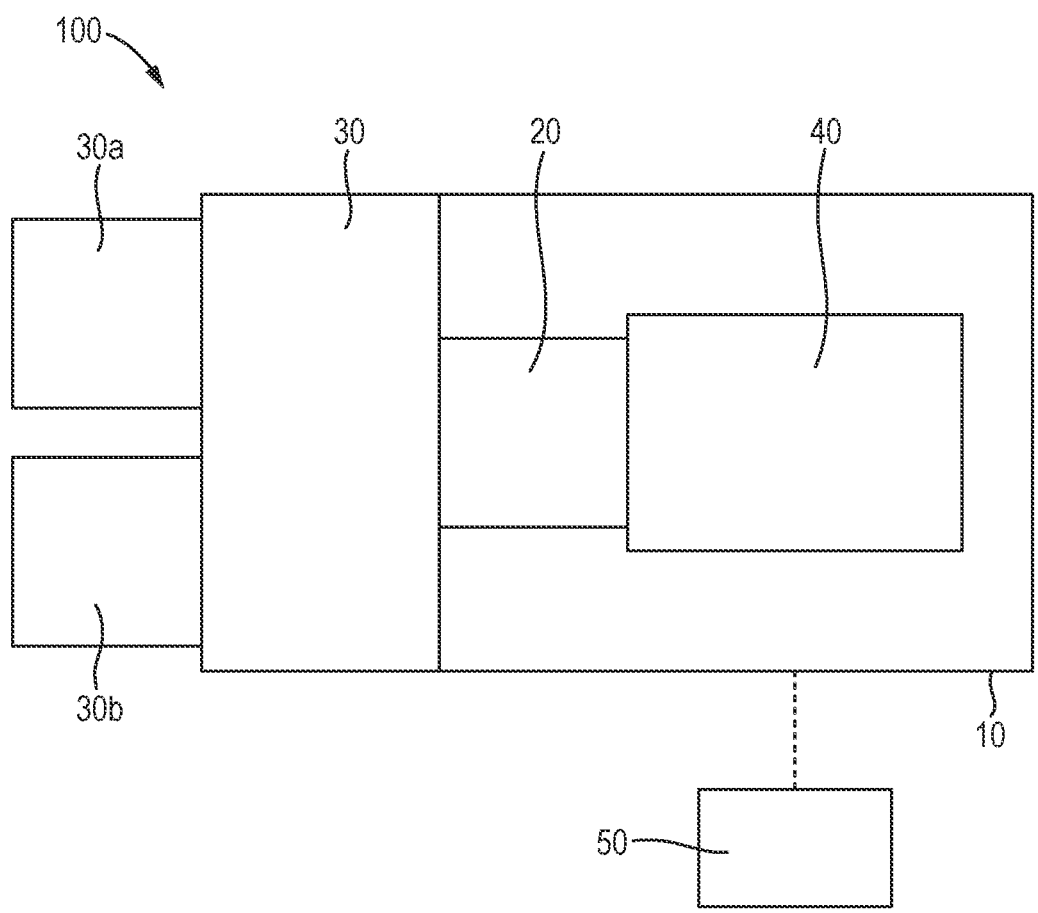
FIG. 1 is a schematic diagram illustrating an exemplary charged particle beam inspection apparatus.

The figures are schematic. The schematic diagrams and views show the components described below. However, the components depicted in the figures are not to scale. Relative dimensions of components in drawings are exaggerated for clarity. Within the following description of drawings the same or like reference numbers refer to the same or like components or entities, and only the differences with respect to the individual embodiments are described.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused primary beams, i.e. a multi-beam, of primary electrons. The component beams of the multi-beam may be referred to as sub-beams or beamlets or an array of primary beams. A multi-beam can scan different parts of a sample simultaneously. A multi-beam inspection apparatus can therefore inspect a sample at a much higher speed than a single-beam inspection apparatus. An implementation of a known multi-beam inspection apparatus is described below.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, a charged particle beam tool 40 (which may otherwise be referred to as an electron beam tool), an equipment front end module (EFEM) 30 and a controller 50. The charged particle beam tool 40 is located within the main chamber 10.

The EFEM 30 includes a first loading port 30a and a second loading port 30b. The EFEM 30 may include additional loading port(s). The first loading port 30a and the second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the charged particle beam tool 40 by which it may be inspected. A charged particle beam tool 40 may comprise a multi-beam charged particle-optical apparatus.

The controller 50 is electronically connected to the charged particle beam tool 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing a charged particle beam inspection tool, it should be noted that aspects of the disclosure in their broadest sense are not limited to a chamber housing a charged particle beam inspection tool. Rather, it is appreciated that the foregoing principles may also be applied to other tools and other arrangements of apparatus that operate under the second pressure.

Figure 2:
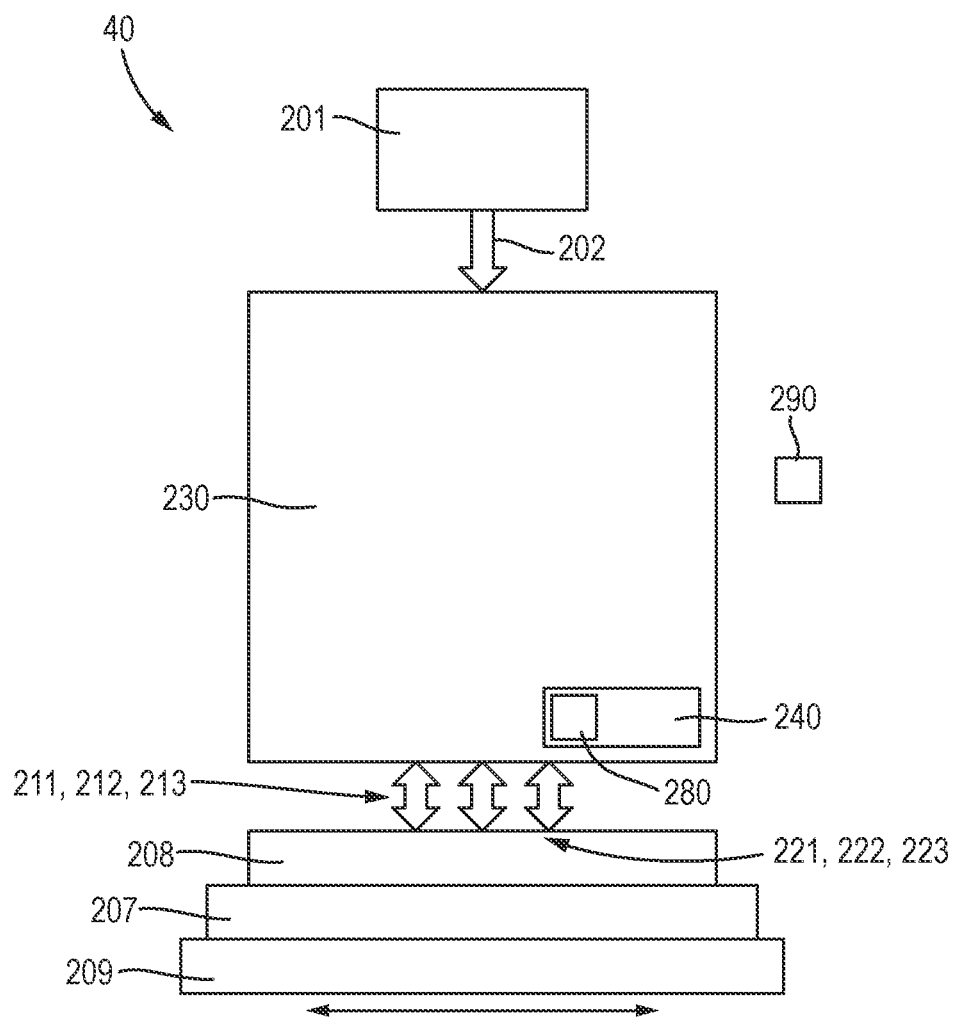
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary charged particle beam tool 40 including a multi-beam inspection tool that is part of the exemplary charged particle beam inspection apparatus 100 of FIG. 1. The multi-beam charged particle beam tool 40 (also referred to herein as apparatus 40) comprises a charged particle source 201, a projection apparatus 230, a motorized stage 209 (or an actuated stage), and a sample holder 207. The charged particle source 201 and projection apparatus 230 may together be referred to as an illumination apparatus. The sample holder 207 is supported by motorized stage 209 so as to hold a sample 208 (e.g., a substrate or a mask) for inspection. The multi-beam charged particle beam tool 40 further comprises a detector array 240 (e.g. an electron detection device).

The controller 50 may be connected to various parts of the charged particle beam inspection apparatus 100 of FIG. 1. The controller 50 may be connected to various parts of the charged particle beam tool 40 of FIG. 2, such as the charged particle source 201, the detector array 240, the projection apparatus 230, and the motorized stage 209. The controller 50 may perform various data, image and/or signal processing functions. The controller 50 may also generate various control signals to govern operations of the charged particle beam inspection apparatus 100, including the charged particle multi-beam apparatus. The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

The charged particle source 201 may comprise a cathode (not shown) and an extractor or anode (not shown). During operation, the charged particle source 201 is configured to emit charged particles (e.g. electrons) as primary charged particles from the cathode. The primary charged particles are extracted or accelerated by the extractor and/or the anode to form a primary charged particle beam 202. The charged particle source 201 may comprise multiple sources, such as described in European patent application publication no. EP3937205, which is incorporated herein in its entirety by reference and at least with respect to the multiple sources and how they relate to multiple columns and their associated charged particle-optics.

The projection apparatus 230 is configured to convert the primary charged particle beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets. Furthermore, although the present description and figures relate to a multi-beam system, a single beam system may be used instead in which the primary charged particle beam 202 is not converted into multiple sub-beams. This is described further below in relation to FIG. 9, but it will be noted that the sub-beams may be interchangeable with a single primary charged particle beam 202.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, signal charged particles (e.g. electrons) are generated (i.e. emitted) from the sample 208 which include secondary signal particles and backscatter signal particles. The signal particles emitted from the sample, e.g. secondary electrons and backscatter electrons, may otherwise be referred to as charged particles, e.g. secondary charged particles and backscatter charged particles. Signal beams are formed of signal particles emitted from the sample. It will generally be understood that any signal beams emitted from the sample 208 will travel in a direction with at least a component substantially opposite to the charged particle beams (i.e. the primary beams), or will have at least a component of direction which is opposite to the direction of the primary beams. Signal particles, which are emitted by the sample 208 may also pass through the electrodes of the objective lens and would also be affected by the field.

The secondary signal particles typically have charged particle energy 50 eV. Actual secondary signal particles can have an energy of less than 5 eV, but anything beneath 50 eV is generally treated as a secondary signal particle. Backscatter signal particles typically have energy between 0 eV and the landing energy of the primary sub-beams 211, 212, and 213. As signal particles detected with an energy of less than 50 eV are generally treated as a secondary signal particles, a proportion of the actual backscatter signal particles will be counted as secondary signal particles. The secondary signal particles may more specifically be referred to, and are interchangeable with, secondary electrons. The backscatter signal particles may more specifically be referred to, and are interchangeable with, backscatter electrons. The skilled person would understand that the backscatter signal particles may more generally be described as secondary signal particles. However, for the purposes of the present disclosure, the backscatter signal particles are considered to be different from the secondary signal particles, e.g. having higher energies. In other words, the secondary signal particles will be understood to be particles having kinetic energy ≤50 eV when emitted from the sampled and the backscatter signal particles will be understood to be particles having kinetic energy higher than 50 eV when emitted from the sample. In practice, the signal particles may be accelerated before being detected and thus, the energy range associated with the signal particles may be slightly higher. For example, the secondary signal particles will be understood to be particles having kinetic energy 200 eV when detected at a detector and the backscatter signal particles will be understood to be particles having kinetic energy higher than 200 eV when detected at a detector. It is noted that the 200 eV value may vary depending on the extent of acceleration of the particles, and may for example be approximately 100 eV or 300 eV. Secondary signal particles having such values are still considered to have sufficient energy different with respect to the backscatter signal particles.

The detector array 240 is configured to detect (i.e. capture) signal particles emitted from the sample 208. The detector array 240 is configured to generate corresponding signals which are sent to a signal processing system 280, e.g. to construct images of the corresponding scanned areas of sample 208. The detector array 240 may be incorporated into the projection apparatus 230. The detector array may otherwise be referred to as a sensor array, and the terms "detector" and "sensor" and "sensor unit" are used interchangeably throughout the application.

The signal processing system 280 may comprise a circuit (not shown) configured to process signals from the detector array 240 so as to form an image. The signal processing system 280 could otherwise be referred to as an image processing system or a data processing system. The signal processing system may be incorporated into a component of the multi-beam charged particle beam tool 40 such as the detector array 240 (as shown in FIG. 2). However, the signal processing system 280 may be incorporated into any components of the inspection apparatus 100 or multi-beam charged particle beam tool 40, such as, as part of the projection apparatus 230 or the controller 50. The signal processing system 280 could be located outside of the structure that includes the main chamber which is shown in FIG. 1. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to the detector array 240 permitting signal communication, such as an electrical conductor, optical fiber cable, portable storage media, IR, Bluetooth, internet, wireless network, wireless radio, among others, or a combination thereof. The image acquirer may receive a signal from the detector array 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary signal particles. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample.

Known multi-beam systems, such as the charged particle beam tool 40 and charged particle beam inspection apparatus 100 described above, are disclosed in U.S. patent application publication nos. US 2020/118784, US 2020/0203116, US 2019/0259570 and US2019/0259564 which are incorporated herein in their entireties by reference.

In known single-beam systems, different signals (e.g. from secondary signal particles and/or backscatter signal particles) might theoretically be detected. Multi-beam systems are known and are beneficial as the throughput can be much higher than when using single-beam systems, e.g. the throughput of a multi-beam inspection system may be 100 times higher than the throughput in a single-beam inspection system.

In known multi-beam systems, an array of primary sub-beams of charged particles at a relatively high energy are targeted with a final deceleration step in order to land on a sample at a relatively low landing energy for detection of secondary signal particles as mentioned above. However, in practice, it has not generally been possible to use multi beam inspection in combination with backscatter detection, or at least by direct backscatter detection, i.e. presently known multi-beam systems rely primarily on detection of secondary signal particles. However, there are limitations in the information which can be obtained solely from secondary signal particles. Backscatter signal particles provide information about structures below the surface, such as buried defects. Additionally, backscatter signals can be used to measure overlay targets.

As described above, backscatter signal particles have a large range of energies, typically between 0 eV and the landing energy. The backscatter signal particles have a large range in energy (for example up to the landing energy of the primary beam) and wide angle of emitted backscatter signal particles. Secondary signal particles typically have a more restricted energy range and tend to be distributed around an energy value. The large energy range and wide angle of emitted backscatter signal particles results in crosstalk in a multi-beam system. Crosstalk occurs when backscatter signal particles resulting from one primary sub-beam are detected at a detector assigned to a different sub-beam. Crosstalk generally occurs very close to the sample 208, i.e. proximate the sample onto which the primary beam is projected. Due to the crosstalk, previously known multi-beam assessment tools have not been able to effectively image backscatter signals. As a consequence, it has not been possible to increase the throughput for backscattered detection by using multi-beam systems.

Components of an assessment tool 40 which may be used in an embodiment of the present invention are described below in relation to FIG. 3 which is a schematic diagram of an assessment tool 40. The charged particle assessment tool 40 of FIG. 3 may correspond to the multi-beam charged particle beam tool (also referred to herein as apparatus 40).

The charged particle source 201 directs charged particles (e.g. electrons) toward an array of condenser lenses 231 (otherwise referred to as a condenser lens array) forming part of the projection system 230. The charged particle source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on European patent application publication no. EP1602121, which is incorporated herein in its entirety by reference and at least with respect to the disclosure of a lens array to split an e-beam into a plurality of sub-beams, with the array providing a lens for each sub-beam. The array of condenser lenses 231 may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect. More generally, the condenser lens array 231 may have two or more plate electrodes each with an array of apertures that are aligned. Each plate electrode array is mechanically connected to, and electrically isolated from, an adjacent plate electrode array by an isolating element, such as a spacer which may comprise ceramic or glass. The condenser lens array may be connected and/or spaced apart from an adjacent charged particle-optical element, preferably an electrostatic charged particle-optical element, by an isolating element such as a spacer as described elsewhere herein.

The condenser lenses may be separated from a module containing the objective lenses (such as an objective lens array assembly as discussed elsewhere herein). In a case where the potential applied on a bottom surface of the condenser lenses is different than the potential applied on the top surface of the module containing the objective lenses an isolating element (e.g. a spacer) is used to space apart the condenser lenses and the module containing the objective lenses. In a case where the potential is equal then a conductive element can be used to space apart the condenser lenses and the module containing the objective lenses.

Each condenser lens 231 in the array directs a primary beam of charged particles into a respective sub-beam 211, 212, 213 which is focused at a respective intermediate focus down beam of the condenser lens array. The respective sub-beams are projected along respective sub-beam paths 220. The sub-beams diverge with respect to each other. The sub-beam paths 220 diverge down beam of the condenser lenses 231. In an embodiment, deflectors 235 are provided at the intermediate focuses. The deflectors 235 are positioned in the sub-beam paths at, or at least around, the position of the corresponding intermediate focusses 233 or focus points (i.e. points of focus). The deflectors are positioned in or close to the sub-beam paths at the intermediate image plane of the associated sub-beam. The deflectors 235 are configured to operate on the respective sub-beams 211, 212, 213. The deflectors 235 are configured to bend a respective sub-beam 211, 212, 213 by an amount effective to ensure that the principal ray (which may also be referred to as the beam axis) is incident on the sample 208 substantially normally (i.e. at substantially 90° to the nominal surface of the sample). The deflectors 235 may also be referred to as collimators or collimator deflectors. The deflectors 235 in effect collimate the paths of the sub-beams so that before the deflectors, the sub-beam paths with respect to each other are diverging. Down beam of the deflectors the sub-beam paths are substantially parallel with respect to each other, i.e. substantially collimated. Suitable collimators are deflectors disclosed in European patent application publication no. EP3863040, which is incorporated herein in its entirety by reference and at least with respect to the application of the deflectors to a multi-beam array. The collimator may comprise a macro collimator 270, instead of, or in addition to the deflectors 235. Thus, the macro-collimator 270 described below in relation to FIG. 8 may be provided with the features of FIG. 3 or FIG. 4. This is generally less preferred than providing the collimator array as deflectors 235.

Below (i.e. down beam or further from source 201) the deflectors 235 there is a control lens array 250. The sub-beams 211, 212, 213 having passed through the deflectors 235 are substantially parallel on entry to the control lens array 250. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations.

In further detail, it is desirable to use the control lens array 250 to determine the landing energy. However, it is possible to use in addition the objective lens array 240 to control the landing energy. In such a case, a potential difference over the objective lens is changed when a different landing energy is selected. One example of a situation where it is desirable to partly change the landing energy by changing the potential difference over the objective lens is to prevent the focus of the sub-beams getting too close to the objective lenses. In such a situation there is a risk of components of the objective lens array 241 having to be too thin to be manufacturable. The same may be said about a detector at this location, for example in, on or otherwise associated with the objective lens. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The control lens array electrodes may be spaced a few millimeters (e.g. 3 mm) apart. The control lens array 250 is associated with the objective lens array 241 (e.g. the two arrays are positioned close to each other and/or mechanically connected to each other and/or controlled together as a unit). Each control lens may be associated with a respective objective lens. The control lens array 250 is positioned up-beam of the objective lens array 241. Up-beam may be defined as being closer to the source 201. Up-beam may otherwise be defined as further from the sample 208. The control lens array 250 may be in the same module as an objective lens array 241, i.e. forming an objective lens array assembly or objective lens arrangement, or it may be in a separate module. In this case, the arrangement may be described as four or more lens electrodes that are plates. In the plates are defined apertures, for example as aperture arrays, which are aligned with a number of sub-beams in a corresponding beam array. The electrodes may be grouped into two or more electrodes, for example to provide a control electrode group, and an objective electrode group. In an arrangement the objective electrode group has at least three electrodes and the control electrode group has at least two electrodes. Alternatively, if the control lens array 250 and the objective lens array 240 are separate, the spacing between the control lens array 241 and the objective lens array 250 (i.e. the gap between lower electrode of the control lens array 250 and the upper electrode of the objective lens 241) can be selected from a wide range, e.g. from 2 mm to 200 mm or more. A small separation makes alignment easier whereas a larger separation allows a weaker lens to be used, reducing aberrations.

Each plate electrode of the control lens array 250 is preferably mechanically connected to, and electrically separated from, an adjacent plate electrode array by an isolating element, such as a spacer which may comprise ceramic or glass. Each plate electrode of the objective lens array is preferably mechanically connected to, and electrically separated from, an adjacent plate electrode array by an isolating element, such as a spacer which may comprise ceramic or glass. The isolating element may otherwise be referred to as an insulating structure, and may be provided to separate any adjacent electrodes provided, such as in the objective lens array 240, the condenser lens array (as depicted in FIG. 3) and/or the control lens array 250. If more than two electrodes are provided, multiple isolating elements (i.e. insulating structures) may be provided. For example, there may be a sequence of insulating structures.

The control lens array 250 comprises a control lens for each sub-beam 211, 212, 213. A control lens adds optical degrees of freedom to the function of the associated objective lens. A control lens may comprise of one or more electrode or plates. The addition of each electrode may provide a further degree of freedom of the control of the charged particle-optical function of the associated objective lens. In an arrangement the function of the control lens array 250 is to optimize the beam opening angle with respect to the demagnification of the beam and/or to control the beam energy delivered to the objective lenses 234, each of which directs a respective sub-beam 211, 212, 213 onto the sample 208. The objective lenses may be positioned at or near the base of the charged particle-optical system. More specifically, the objective lens array may be positioned at or near the base of the projection system 230. The control lens array 250 is optional, but is preferred for optimizing a sub-beam upbeam of the objective lens array.

Figure 3:
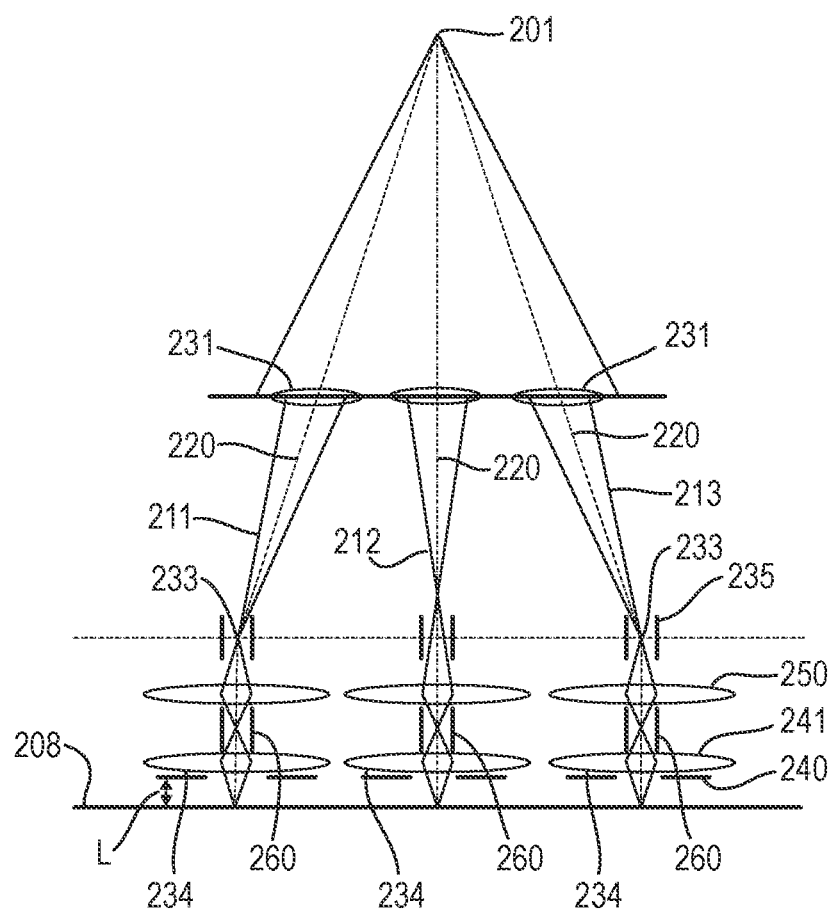
FIG. 3 is a schematic diagram of an exemplary multi-beam apparatus according to an embodiment.

For ease of illustration, lens arrays are depicted schematically herein by arrays of oval shapes (as shown in FIG. 3). Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. Lens arrays may instead comprise multiple plates with apertures.

Optionally, an array of scan deflectors 260 is provided between the control lens array 250 and the array of objective lenses 234. The array of scan deflectors 260 comprises a scan deflector for each sub-beam 211, 212, 213. Each scan deflector is configured to deflect a respective sub-beam 211, 212, 213 in one or two directions so as to scan the sub beam across the sample 208 in one or two directions.

Figure 4:
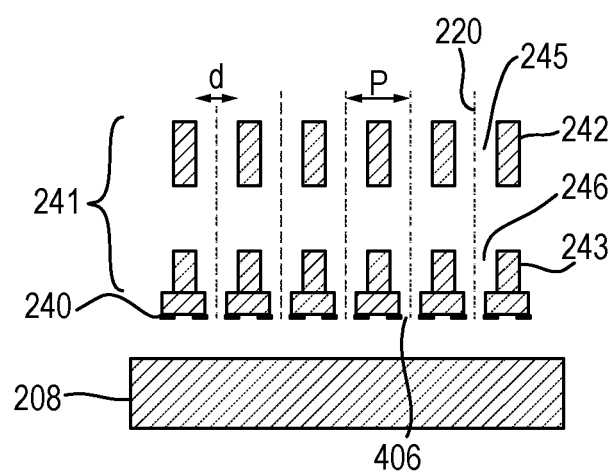
FIG. 4 is a schematic cross-sectional view of an objective lens according to an embodiment.

The objective lens array 241 may comprise at least two electrodes in which are defined aperture arrays. In other words, the objective lens array comprises at least two electrodes with a plurality of holes or apertures. Adjacent electrodes of the objective lens array 241 are spaced apart from each other along the sub-beam paths. The distance between adjacent electrodes along the beam path, in which an insulating structure might be positioned as described below, is smaller than the size of an objective lens (along the beam path, i.e. between the most upbeam and most down beam electrode of the objective lens array). FIG. 4 shows electrodes 242, 243 which are part of an exemplary objective lens array 241 having respective aperture arrays 245, 246. The position of each aperture in an electrode corresponds to the position of a corresponding aperture in another electrode. The corresponding apertures operate in use on the same beam, sub-beam or group of sub-beams in the multi-beam. In other words, corresponding apertures in the at least two electrodes are aligned with and arranged along a sub-beam path, i.e. one of the sub-beam paths 220. Thus, the electrodes are each provided with apertures through which the respective sub-beam 211, 212, 213 propagates.

The aperture arrays 245, 246 of the objective lens array 241 may consist of a plurality of apertures, preferably with substantially uniform diameters, d. However there may be some variation for optimizing aberration correction as described in European patent application publication no. EP4002421, which is incorporated herein in its entirety by reference and at least with respect to corrections achieved by varying aperture diameter. The diameter, d, of the apertures in at least one electrode may be less than approximately 400 μm. Preferably, the diameter, d, of the apertures in at least one electrode is between approximately 30 to 300 μm. Smaller aperture diameters may provide larger detectors of the detector array 240 for a given aperture pitch, improving the chance of capturing backscatter signal particles. Thus the signal for the backscatter signal particles may improve. However, having apertures that are too small risk inducing aberrations in the primary sub-beams. The plurality of apertures in an electrode may be spaced apart from each other by a pitch, P. The pitch, P, is defined as the distance from the middle of one aperture to the middle of an adjacent aperture. The pitch between adjacent apertures in at least one electrode may be less than approximately 600 μm. Preferably, the pitch between adjacent apertures in at least one electrode is between approximately 50 μm and 500 μm. Preferably, the pitch between adjacent apertures on each electrode is substantially uniform. The values for the diameter and/or pitch described above can be provided in at least one electrode, multiple electrodes, or all electrodes in an objective lens array. Preferably, the dimensions referred to and described apply to all electrodes provided in an array of objective lenses.

The objective lens array 241 may comprise two or three electrodes or may have more electrodes (not shown). An objective lens array 241 having only two electrodes can have fewer aberrations, e.g. a lower aberration risk and/or impact, than an objective lens array 241 having more electrodes. A three-electrode objective lens can have greater potential differences between the electrodes and so enable a stronger lens. Additional electrodes (i.e. more than two electrodes) provide additional degrees of freedom for controlling the charged particle trajectories, e.g. to focus secondary signal particles as well as the incident beam. A benefit of two electrode lens over an Einzel lens is that the energy of an in-coming beam is not necessarily the same as an out-going beam. Beneficially the potential differences on such a two electrode lens array enables it to function as either an accelerating or a decelerating lens array. The objective lens array 241 can be configured to demagnify the charged particle beam by a factor greater than 10, desirably in the range of 50 to 100 or more. Each element in the objective lens array 240 may be a micro-lens operating a different sub-beam or group of sub-beams in the multi-beam.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

Figure 5:
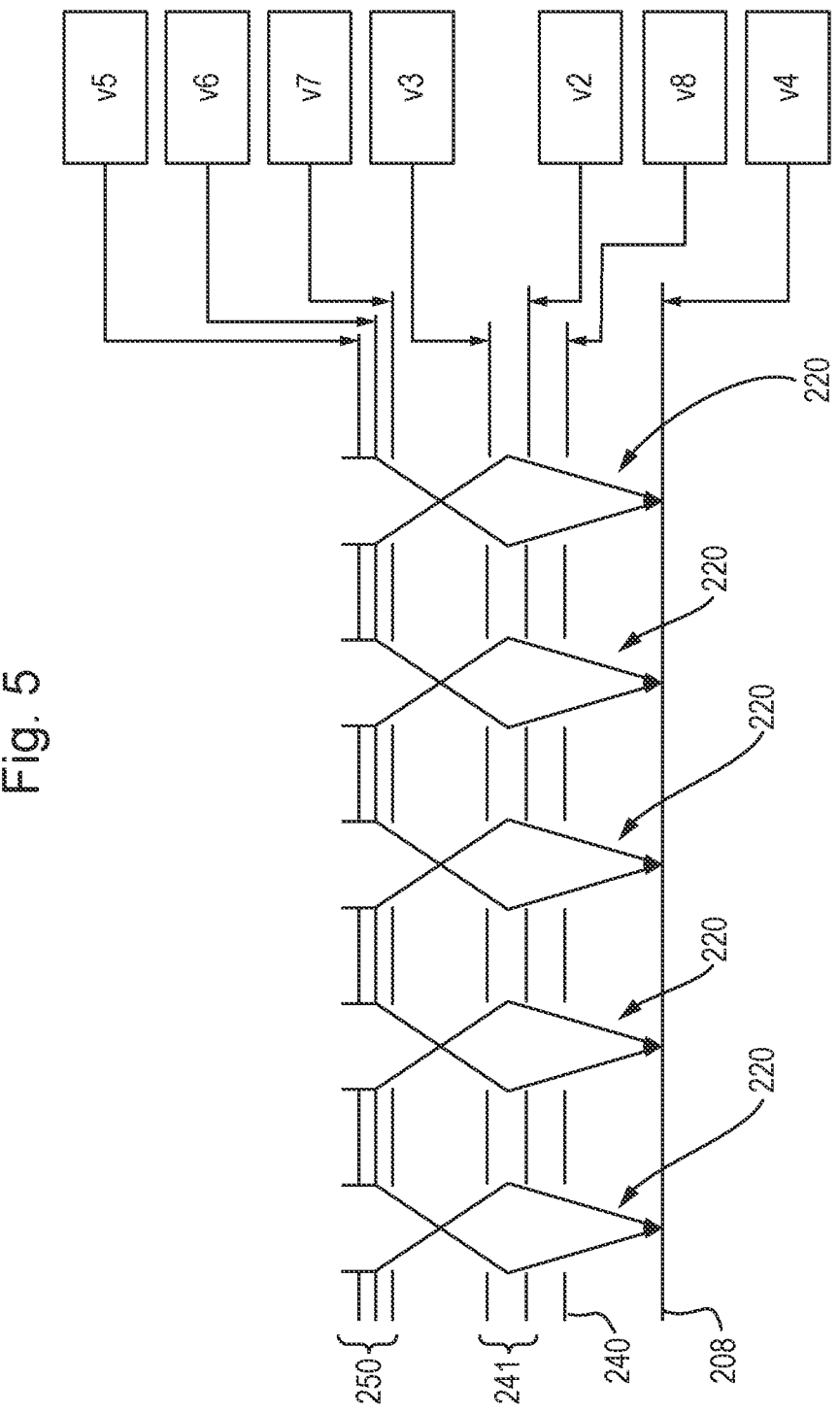
FIG. 5 is a schematic diagram of an exemplary charged particle optical device according to an embodiment.

FIG. 5 is an enlarged schematic view of multiple objective lenses of the objective lens array 241 and multiple control lenses of the control lens array 250. As described in further detail below, the lens arrays can be provided by electrodes with a selected potential applied to the electrode by a voltage source, i.e. electrodes of the arrays are connected to respective potential sources. In FIG. 5, multiple lenses of each of the control lens array 250, the objective lens array 241 and the detector array 240 are depicted, for example, with any of sub-beams 211, 212, 213 passing through the lenses as shown. Although FIG. 5 depicts five lenses, any appropriate number may be provided; for example, in the plane of the lenses, there may be 100, 1000 or of the order of 10,000 lenses. Features that are the same as those described above are given the same reference numerals. For conciseness, the description of these features provided above applies to the features shown in FIG. 5. The charged particle optical device may comprise one, some or all of the components shown in FIG. 5. Note that this figure is schematic and may not be to scale. For example, in a non-limited list: the sub-beams may be narrower at the controller array 250 than at the objective lens array 241; the detector array 240 may be closer to the electrodes of the objective lens array 241 than the electrodes of the objective lens array 241 are to each other; and a focus point of each sub-beam between the controller lens array 250 may be closer to the objective lens array 241 than depicted. Spacing between electrodes of the control lens array 250 may be larger than spacing between electrodes of the objective lens array 241 as shown in FIG. 5, but this is not a necessity.

Figure 8:
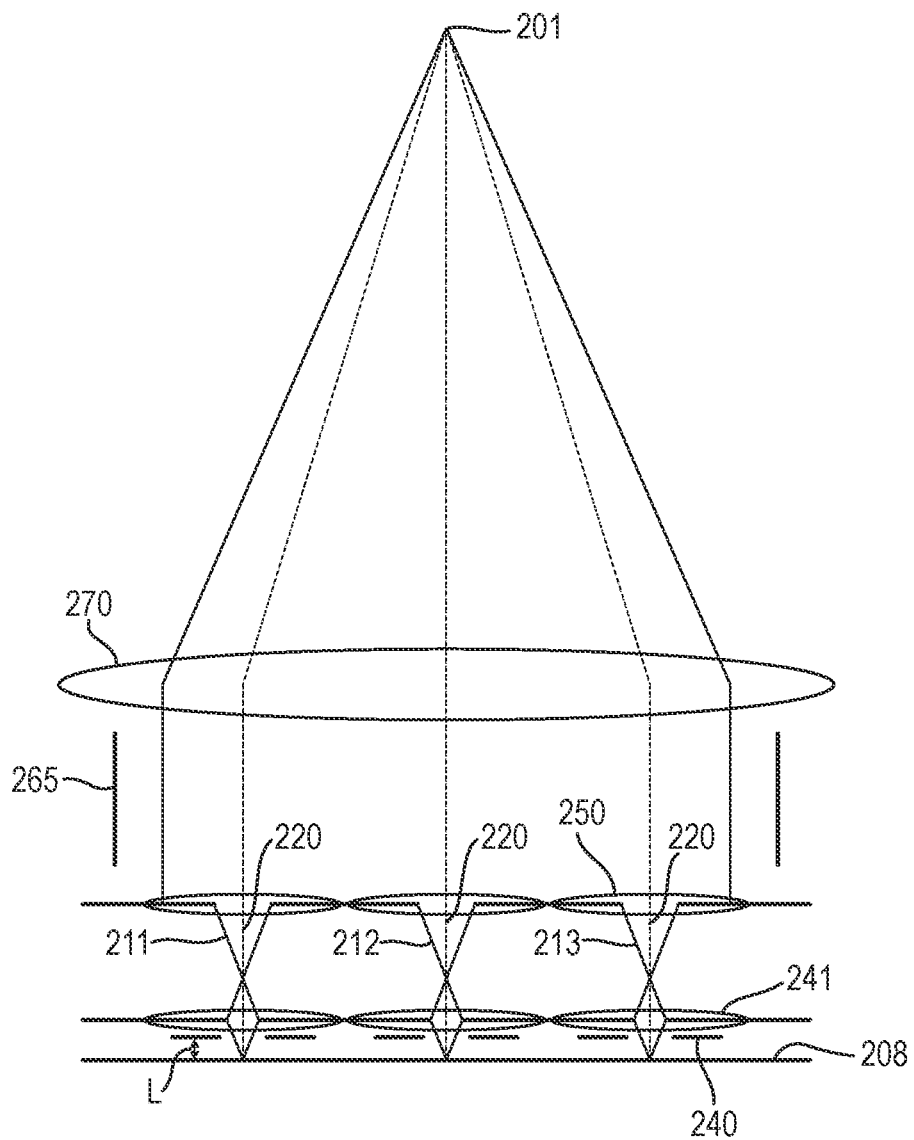
FIG. 8 is a schematic diagram of an exemplary charged particle-optical system comprising a macro collimator and macro scan deflector.

As shown in FIG. 5, the sub-beams may be parallel on entry into the control lens array 250, as shown in FIG. 3. However, the same components of FIG. 5 may be used in a configuration as shown in FIG. 8, in which case, the sub-beams may be separated (or generated) from a beam from a source further down beam. For example, the sub-beams may be defined by a beam limiting aperture array which may be part of a lens arrangement such as an objective lens array, a control lens array, or any other lens element that may be associated with an objective lens array for example that is part of an objective lens array assembly. As depicted in FIG. 8, the sub-beams may be separated from the beam from the source by a beam limiting aperture array that may be part of the control lens array 250 as a most up beam electrode of the control lens array 250.

Voltage sources V3 and V2 (which may be provided by individual electric power sources, or may all be supplied by electric power source 290) are configured to apply potentials to the upper and lower electrodes of the objective lens array 241 respectively. The upper and lower electrodes may be referred to as an up-beam electrode 242 and a down-beam electrode 243 respectively. Voltage sources V5, V6, V7 (which may be provided by individual electric power sources, or may all be supplied by electric power source 290) are configured to apply potentials to the first, second and third electrodes of the control lens array 250 respectively. A further voltage source V4 is connected to the sample to apply a sample potential. A further voltage source V8 is connected to the detector array to apply a detector array potential. Although the control lens array 250 is shown with three electrodes, the control lens array 250 may be provided with two electrodes (or more than three electrodes). Although the objective lens array 240 is shown with two electrodes, the objective lens array 240 may be provided with three electrodes (or more than three electrodes). For example, a middle electrode may be provided in the objective lens array 241 between the electrodes shown in FIG. 5 with a corresponding voltage source, V1 (not shown).

Desirably, the potential V5 of the uppermost electrode of the control lens array 250 is maintained the same as the potential of the next charged particle-optic element up-beam of the control lens (e.g. deflectors 235). The potential V7 applied to the lower electrode of the control lens array 250 can be varied to determine the beam energy. The potential V6 applied to the middle electrode of the control lens array 250 can be varied to determine the lens strength of the control lens and hence control the opening angle and demagnification of the beam. It should be noted that even if the landing energy does not need to be changed, or is changed by other means, the control lens can be used to control the beam opening angle. The position of the focus of a sub-beam is determined by the combination of the actions of the respective control lens array 250 and the respective objective lens 240.

The detector array 240 (which may otherwise be referred to as an array of detectors) comprises a plurality of detectors. Each detector is associated with a corresponding sub-beam (which may otherwise be referred to as a beam or primary beam). In other words, the arrays of detectors (i.e. the detector array 240) and sub-beams correspond. Each detector may be assigned to a sub-beam. The array of detectors may correspond with the array of objective lenses. In other words, the array of detectors may be associated with the corresponding array of objective lenses. A detector array 240 is described below. However, any reference to detector array 240 could be replaced with a single detector (i.e. at least one detector) or multiple detectors as appropriate. The detectors may otherwise be referred to as of detector elements 405 (e.g. sensor elements such as capture electrodes). The detectors may be any appropriate type of detector.

The detector array 240 may be positioned at a position along the primary beam path at any location between an upper beam position and a lower beam position along the beam path. The upper beam position is above the objective lens array and optionally any associated lens arrays such as a control lens array (i.e. up beam of an objective lens array assembly). The lower beam position is down beam of the objective lens array. In an arrangement the detector array may be an array that is up beam of the objective lens array assembly. The detector array may be associated with any electrode of the objective lens array assembly. Reference hereafter of a detector in association with an electrode of the objective lens array may correspond to an electrode of the objective lens array assembly, except for the most down beam surface of the most down beam electrode of the objective lens array, unless stated explicitly otherwise.

In an arrangement the detector array 240 may be positioned between the control lens array 250 and the sample 208. The detector array 240 may be positioned between the objective lenses 234 and the sample 208, as shown in FIG. 4 and FIG. 5. Although this may be preferable, the detector array 240 could be provided in additional or alternative locations, such as those depicted in FIG. 7. Multiple detector arrays may be provided in a variety of locations, e.g. as in FIG. 7. The signal particles, including backscatter signal particles may be detected directly from the surface of the sample 208. Thus, the backscatter signal particles may be detected without having to be converted, for example, into another type of signal particle such a secondary signal particle which may be easier to detect. Thus, the backscatter signal particles may be detected by the detector array 240 without encountering, e.g. hitting, any other components or surfaces between the sample 208 and the detector array 241.

The detector array is positioned between the objective lens array 241 and the sample 208. The detector array 240 is configured to be proximate the sample. The detector array 240 may be proximate the sample so as to detect backscatter signal particles from the sample 208. The detector being proximate the sample enables the risk of cross-talk in detection of backscatter signal particles generated by sub-beams which correspond to another detector in the detector array to be reduced if not avoided. In other words, the detector array 240 is very close to the sample 208. The detector array 240 may be within a certain distance of the sample 208, as described below. The detector array 240 may be adjacent to the sample 208. The at least one detector may be positioned in the device so as to face the sample. That is the detector may provide a base to the device. The detector as part of the base may face a surface of the sample. This may be beneficial in positioning the at least one detector in a location in which the at least one detector is more likely to detect backscatter particles than secondary particles. For example, the at least one detector array may be provided on an output side of the objective lens array 241. The output side of the objective lens array 241 is the side on which the sub-beams are output from the objective lens array 241, i.e. the bottom or downbeam side of the objective lens array in the configuration shown in FIG. 3, FIG. 4 and FIG. 5. In other words, the detector array 240 may be provided downbeam of the objective lens array 241. The detector array may be positioned on, or adjacent to, the objective lens array. The detector array 241 may be an integral component of the objective lens array 241. The detector and objective lens may be part of the same structure. The detector may be connected to the lens by an isolating element or directly to an electrode of the objective lens. Thus, the at least one detector may be part of an objective lens assembly comprising at least the objective lens array and the detector array. If the detector array is an integral component of the objective lens array 241, the detector array 240 may be provided at the base of the objective lens array 241. In an arrangement the detector array 240 may be integral to the most-down-beam positioned electrode of the objective lens array 241.

Ideally, the detector array is as close as possible to the sample. The detector array 240 is preferably very close to the sample 208 such that there is a proximity focus of backscatter signal particles at the detector array. As previously described, the energy and angular spread of the backscatter signal particles is generally so large that it is difficult (or impossible in known prior art systems) to keep the signals from neighboring sub-beams separated. However, the proximity focus means that backscatter signal particles can be detected at a relevant one of the detectors without cross-talk (i.e. interference from neighboring sub-beams) in the first aspect. Of course, there is a minimum distance between the sample 208 and the detector array 240. However, it is preferable to reduce this distance as much as possible. Certain configurations may benefit from reducing the distance even more than others.

Figure 9:
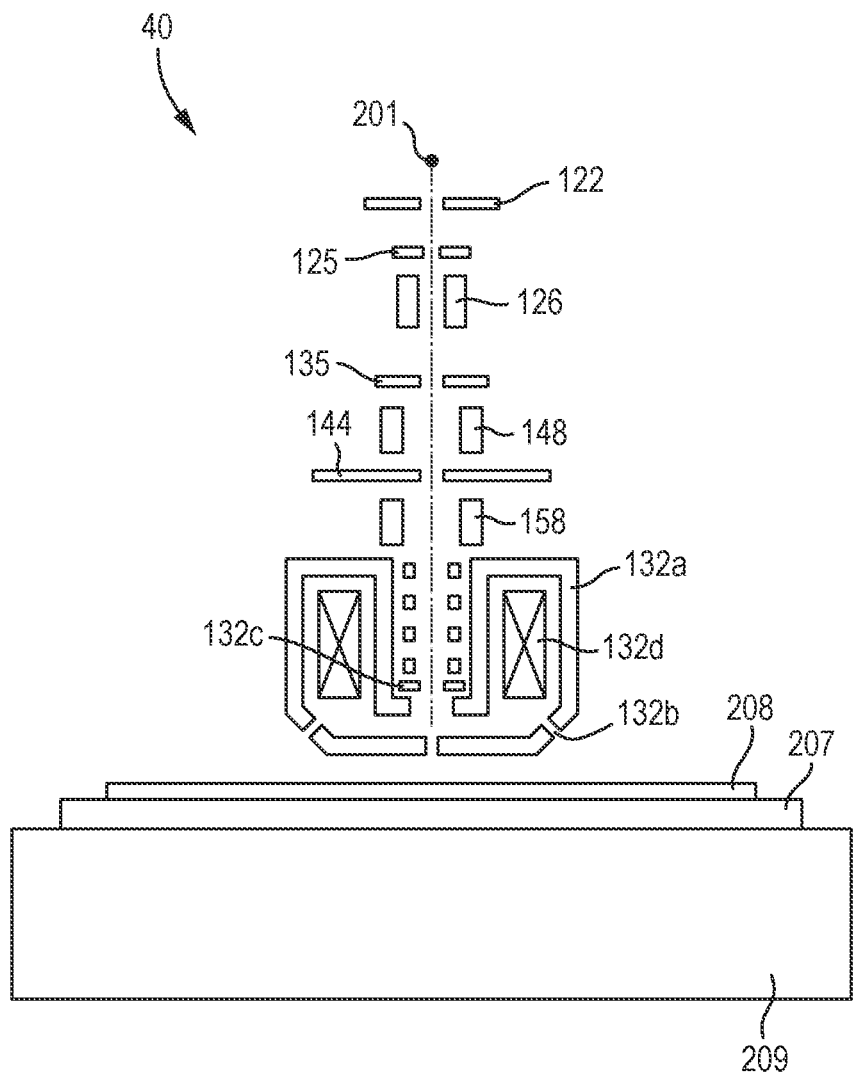
FIG. 9 is a schematic diagram of an exemplary single beam apparatus according to an embodiment.

Preferably, a distance 'L' as shown in FIG. 3, between the detector array 240 and the sample 208 is less than or equal to approximately 50 µm, i.e. the detector array 240 is positioned within approximately 50 µm from the sample 208. Although is generally preferably that the distance L is small (e.g. between around 10 to 65 microns), as this can improve detector efficiency and/or reduce crosstalk, the distance may be greater. For example, the distance L may be approximately 100 microns or less, or approximately 200 microns or less. The distance L is determined as the distance from a surface of the sample 208 facing the detector array 240 and a surface of the detector array 241 facing the sample 208. Providing a distance of approximately 50 µm or less is beneficial in that cross-talk between backscatter signal particles can be avoided or minimized. Theoretically, there may be a lower limit of how close the sample 208 and the detector array 240 can be whilst allowing these components to move relative to each other and this may mean that the distance L might be more than approximately 5 µm or 10 µm. For example, a distance L of approximately 50 µm or less may be used whilst still allowing relatively reliable control of the device as shown as part of the tool in FIG. 3. A distance L of approximately 30 µm or less may be preferable for other configurations, such as those shown and described in relation to FIG. 8 below. A preferred range of the distance L between the detector array 240 and the sample 208 may be between approximately 5 µm to 200 µm, or preferably between approximately 5 µm to 100 µm, or preferably between approximately 5 µm to 50 µm, or preferably between approximately 10 µm to 50 µm, or preferably between approximately 30 µm to 50 µm. In an arrangement the detector array 240 may be actuatable relative to the objective lens array 241, i.e. to vary the distance L, for example to substantially maintain a distance between the sample and the detector array L. It is noted that the distance L described here is for a multi-beam system as shown in FIG. 3 (or FIG. 8). The same distance may be used in a single beam device, e.g. as shown in FIG. 9, although the distance L may be larger for the single beam device.

The backscatter signal particles are emitted from the sample 208 with a very large energy spread, and typically with an angular spread following a cosine distribution which may take the appearance in three dimensions of a cone. The further the distance from sample 208 to the detector array 240, the larger the cone of the emitted beam becomes. It will be understood that the backscatter signal particles can have all angles. The cone of the emitted beam is the solid angle assignable to the detector associated with a respective beam, so that this solid angle is larger with greater proximity of the sample and the detector. Because of the very large energy spread it may not be possible to image the backscatter signal particles coming from the different sub-beams onto a detector without introducing significant cross talk. The solution is to place the detector in close proximity to the substrate and choose the pitch of the sub-beams such that the backscatter signal particle signals of the neighbouring sub-beams to not overlay.

Thus, the pitch size, P, as discussed above may be selected depending on the distance between the detector array 240 and the sample 208 (or vice versa). For example only, for a distance L between the sample 208 and the detector array 240 of approximately 50 microns, the sub-beam pitch p may be equal to or larger than approximately 300 microns. Such a combination may be particularly useful for detecting high energy signal particles, e.g. backscatter signal particles, with an accelerating lens. For example only, for a distance L between the sample 208 and the detector array 240 of approximately 10 microns, the sub-beam pitch p may be equal to or larger than approximately 60 microns. Providing a closer detector array allows use of a smaller sub-beam pitch p. This may be beneficial in using certain configurations in which the sub-beam pitch is beneficially smaller, such as the configuration described in relation to, and shown in, FIG. 8 below. In a different example arrangement the distance between the sample 208 an the detector array 240 is approximately 50 microns and the sub-beam pitch p is approximately 60 microns. Such a different set up is intended for different operational settings and to detect a different type of signal particle. For example, such a combination may be particularly useful for detecting low energy signal particles, e.g. secondary signal particles, with a decelerating lens. For simultaneous detection of high energy particles (e.g. backscatter signal particles) and low energy particles (e.g. secondary signal particles), the pitch p and distance L may be selected between the values described above so that the high energy particle and low energy particle signals are sufficiently large. It will be noted that there is no relation or limitation for the distance L and the pitch p for the functioning of the detector. However, due to a risk of crosstalk in neighboring detectors it might be preferable to use a larger pitch p for a larger distance L. Although, there may also be other ways to reduce the risk of crosstalk and any appropriate combination of pitch p and distance L may be used.

The detector array 240 (and optionally the objective lens array 241) may be configured to repel secondary signal particles emitted from the sample 208. This is beneficial as it reduces the number of secondary signal particles emitted from the sample 208 which travel back towards the detector array 240. The difference in potential between the detector array 240 and the sample 208 can be selected to repel signal particles emitted from the sample 208 away from the detector array 240. Preferably, the detector array potential may be the same as the potential of the downbeam electrode of the objective lens array. The potential difference between the sample potential and the detector array potential is preferably relatively small so that primary sub-beams are projected through or past the detector array 240 to the sample 208 without being significantly affected. Additionally, a small potential difference will have a negligible effect on the path of a backscatter signal particle (which generally has a greater energy up to the landing energy), meaning that the backscatter signal particles can still be detected whilst reducing or avoiding detection of secondary signal particles. The potential difference between the sample potential and the detector array potential is preferably greater than a secondary signal particle threshold. The secondary signal particle threshold may determine the minimum initial energy of secondary signal particles that can still reach the detector. Preferably, the secondary signal particle threshold is the potential difference equivalent to the likely energy of a secondary signal particle emanating from the sample 208. That is the relatively small potential difference between the sample and detector array potentials is sufficient to repel the secondary signal particles from the detector array. For example, the potential difference between the sample potential and the detector array potential may be approximately 20 V, 50 V, 100 V, 150 V, 200 V, 250 V, or 300V.

The objective lens array 241 may be configured to accelerate the primary charged particles (i.e. the sub-beams) towards the sample 208 along the sub-beam paths 220. Accelerating the sub-beams 211, 212, 213 projected onto the sample 208 is beneficial in that it can be used to generate an array of sub-beams with high landing energy. The potentials of the electrodes of the objective lens array can be selected to provide acceleration through the objective lens array 241. It is noted that an accelerating lens in the arrangement may be particularly useful for detecting ranges (e.g. different energy ranges) of backscatter signal particles. Alternatively, the objective lens array may be configured to decelerate the primary charged particles towards the sample 208 along the sub-beam paths 220. It is noted that a decelerating lens in the arrangement may be particularly useful for detecting both secondary and backscatter signal particles. The figures described below, and particularly FIGS. 3, 5 and 8, show the objective lens in the accelerating mode. However, as will be understood from the description above, the objective lens may be used in the decelerating mode instead for any of the embodiments and variations described below. In other words, FIGS. 3, 5 and 8 could be adapted to decelerate the sub-beams through the objective lenses.

In an arrangement of accelerating objective lens array 241, the low energy particles (e.g. secondary signal particles) generally cannot pass up-beam of the lower part of the accelerating objective lens. It is also increasing difficult for high energy particles (e.g. backscatter signal particles) to pass the accelerating objective lens. This is a key point for both accelerating and decelerating objective lenses. The energy difference between the low energy signal particles (e.g. secondary signal particles) and high energy signal particles (e.g. backscatter signal particles) is proportionately larger down-beam of the objective lens (in both accelerating and decelerating mode) than at any point up-beam of the objective lens. This is beneficial for detection using the detectors described below to distinguish between the different types of signal particles.

The potentials and the values of the potentials defined herein are defined with respect to the source; hence the potential of a charged particle at the surface of the sample may be referred to as a landing energy because the energy of a charged particle correlates to the potential of the charged particle and the potential of the charged particle at the sample is defined with respect to the source. However, as the potentials are relative values, the potentials could be defined relative to other components, such as the sample. In this instance, the difference in potential applied to different components would preferably be as discussed below with respect to the source. The potentials are applied to the relevant components, such as the electrodes and the samples during use, i.e. when the device is being operated.

For example, the device being configured to accelerate the charged particle sub-beams and repel the secondary signal particles as described above may have potentials as shown in the context of FIG. 5 with the values in Table 1 below. As mentioned above, the objective lens array as shown in FIG. 5 may comprise an additional electrode, e.g. a middle electrode. Such a middle electrode is optional and need not be included with the electrodes having the other potentials listed in Table 1. The middle electrode of the objective lens array may have the same potential (e.g. V1) as the upper electrode of the objective lens array (i.e. V3).

Exemplary ranges are shown in the left hand column of Table 1 as described above. The middle and right hand columns show more specific example values for each of V1 to V8 within the example ranges. The middle column may be provided for a smaller resolution than the right hand column. If the resolution is larger (as in the right hand column), the current per sub-beam is larger and therefore, the number of sub-beams may be lower. The advantage of using a larger resolution is that the time needed to scan a "continuous area" is shorter (which can be a practical constraint). So the overall throughput may be lower, but the time needed to scan the beam area is shorter (because the beam area is smaller).

TABLE 1

| | | | |
|---|---|---|---|
| Landing Energy | >10-100 keV | 30 keV | 30 keV |
| V1 (or omitted) | 1-10 keV | 5 keV | 5 keV |
| V2 | >10-100 keV | 29.95 keV | 29.95 keV |
| V3 | 1-10 keV | 5 keV | 5 keV |
| V4 | >10-100 keV | 30 keV | 30 keV |
| V5 | >10-100 keV | 30 keV | 30 keV |
| V6 | 1-30 keV | 4.4 keV | 10 keV |
| V7 | 1-10 keV | 5 keV | 5 keV |
| V8 | >10-100 keV | 29.95 keV | 29.95 keV |

For example, the device being configured to decelerate the charged particle sub-beams and repel the secondary signal particles as described above may have potentials as shown in the context of FIG. 5 with the values in Table 2 below. The values of the potentials provided for the accelerating lens might be swapped and adjusted to provide a deceleration. For example only, the charged particles may be decelerated from 30 kV to 2.5 kV in the objective lens. In an example, to obtain landing energies in the range of 1.5 kV to 5 kV, potentials shown in FIG. 5, such as V2, V3, V4, V5, V6 and V7, can be set as indicated in Table 2 below. V1 is optionally included if a middle objective lens electrode is included. The potentials and landing energies shown in Table 2 are examples only and other landing energies could be obtained, for example, the landing energy could be lower than 1.5 kV (e.g. approximately 0.3 kV or 0.5 kV) or higher than 5 kV. It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields. The potentials in this table are given as values of beam energy in keV, which is equivalent to the electrode potential relative to the cathode of the beam source 201. It will be understood that in designing a charged particle-optical system there is considerable design freedom as to which point in the system is set to a ground potential and the operation of the system is determined by potential differences rather than absolute potentials.

TABLE 2

| Landing Energy | 1.5 keV | 2.5 keV | 3.5 keV | 5 keV |
|---|---|---|---|---|
| V1 (or omitted) | 29 keV | 30 keV | 31 keV | 30 keV |
| V2 | 1.55 keV | 2.55 keV | 3.55 keV | 5.05 keV |
| V3 | 29 keV | 30 keV | 31 keV | 30 keV |
| V4 | 1.5 keV | 2.5 keV | 3.5 keV | 5 keV |
| V5 | 30 keV | 30 keV | 30 keV | 30 keV |
| V6 | 19.3 keV | 20.1 keV | 20.9 keV | 30 keV |
| V7 | 29 keV | 30 keV | 31 keV | 30 keV |
| V8 | 1.55 keV | 2.55 keV | 3.55 keV | 5.05 keV |

In order to maximize the detection efficiency it is desirable to make the surface of the detector elements 405 as large as possible, so that substantially all the area of the objective lens array 240 (excepting the apertures) is occupied by detector elements 405. Additionally or alternatively, each detector element 405 has a diameter substantially equal to the array pitch (i.e. the aperture array pitch described above in relation to the electrodes of the objective lens assembly 241). In an embodiment the outer shape of the detector element 405 is a circle, but this can be made a square or a hexagon to maximize the detection area.

However a larger surface for the detector elements 405 leads to a larger parasitic capacitance, so a lower bandwidth. For this reason it may be desirable to limit the outer diameter of the detector elements 405. Especially in case a larger detector element 405 gives only a slightly larger detection efficiency, but a significantly larger capacitance. A circular (annular) detector element 405 may provide a good compromise between collection efficiency and parasitic capacitance. A larger outer diameter of the detector element 405 may also lead to a larger crosstalk (sensitivity to the signal of a neighboring hole). This can also be a reason to make the outer diameter of the detector element 405 smaller. Especially in case a larger detector element 405 gives only a slightly larger detection efficiency, but a significantly larger crosstalk.

In an embodiment, the objective lens array 241 is an exchangeable module, either on its own or in combination with other elements such as the control lens array and/or detector array. The exchangeable module may be field replaceable, i.e. the module can be swapped for a new module by a field engineer. In an embodiment, multiple exchangeable modules are contained within the tool and can be swapped between operable and non-operable positions without opening the tool.

In some embodiments, one or more aberration correctors are provided that reduce one or more aberrations in the sub-beams. The one or more aberration correctors may be provided in any of the embodiments, e.g. as part of the charged particle-optical device, and/or as part of an optical lens array assembly, and/or as part of an assessment tool. In an embodiment, each of at least a subset of the aberration correctors is positioned in, or directly adjacent to, a respective one of the intermediate foci (e.g. in or adjacent to the intermediate image plane). The sub-beams have a smallest cross-sectional area in or near a focal plane such as the intermediate plane. This provides more space for aberration correctors than is available elsewhere, i.e. up beam or down beam of the intermediate plane (or than would be available in alternative arrangements that do not have an intermediate image plane).

In an embodiment, aberration correctors positioned in, or directly adjacent to, the intermediate foci (or intermediate image plane) comprise deflectors to correct for the source 201 appearing to be at different positions for different sub-beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream (or down-beam). The condenser lenses and correctors may be part of the same structure. For example they may be connected to each other, for example with an electrically isolating element. The aberration correctors may be CMOS based individual programmable deflectors as disclosed in European patent application publication no. EP2702595 or an array of multipole deflectors as disclosed in European patent application publication no. EP2715768, which are both incorporated herein in their entireties by reference and with respect to at least the descriptions of the sub-beam manipulators in both documents.

In some embodiments, each of at least a subset of the aberration correctors is integrated with, or directly adjacent to, one or more of the objective lenses 234. In an embodiment, these aberration correctors reduce one or more of the following: field curvature; focus error; and astigmatism. The objective lenses and/or control lenses and correctors may be part of the same structure. For example they may be connected to each other, for example with an electrically isolating element. Additionally or alternatively, one or more scanning deflectors (not shown) may be integrated with, or directly adjacent to, one or more of the objective lenses 234 for scanning the sub-beams 211, 212, 213 over the sample 208. In an embodiment, the scanning deflectors described in United States patent application publication no. US 2010/0276606, which is incorporated herein in its entirety by reference, may be used.

In an embodiment, a single detector element 405 surrounds each beam aperture 406. In another embodiment, a plurality of detector elements 405 are provided around each beam aperture 406. Thus, the detector comprises multiple portions, and more specifically, multiple detecting portions. The different portions may be referred to as different zones. Thus the detector may be described to have multiple zones or detection zones. Such a detector may be referred to as a zoned detector. The signal particles captured by the detector elements 405 surrounding one beam aperture 406 may be combined into a single signal or used to generate independent signals. The detector comprising multiple portions may be provided in any of the detector arrays described herein.

The zoned detector may be associated with one of the sub-beams 211, 212, 213. Thus, the multiple portions of one detector may be configured to detect signal particles emitted from the sample 208 in relation to one of the sub-beams 211, 212, 213. The detector comprising multiple portions may be associated with one of the apertures in at least one of the electrodes of the objective lens assembly. More specifically, the detector 405 comprising multiple portions may be arranged around a single aperture 406 as shown in FIG. 6A and FIG. 6B, which provide examples of such a detector.

The portions of the zoned detector may be separated in a variety of different ways, e.g. radially, annular, or any other appropriate way. Preferably the portions are of similar angular size and/or similar area and/or similar shape, for example as shown in FIG. 6B. The separated portions may be provided as a plurality of segments, a plurality of annular portions (e.g. a plurality of concentric annuli or rings), and/or a plurality of sector portions (i.e. radial portions or sectors). The detector elements 405 may be divided radially. For example, the at least one detector 405 may be provided as annular portions comprising 2, 3, 4, or more portions. More specifically, as shown in FIG. 6A, the detector 405 may comprise an inner annular portion 405A surrounding aperture 406 and an outer annular portion 405B, radially outwards of the inner annular portion 405A. Alternatively, the detector elements 405 may be divided angularly. For example, the detector may be provided as sector portions comprising 2, 3, 4, or more portions, for example 8, 12 etc. If the detector is provided as two sectors, each sector portion may be a semi-circle. If the detector is provided as four sectors, each sector portion may be a quadrant. This is shown in FIG. 6B in which the 405 is divided into quadrants, i.e. four sector portions is shown in FIG. 6B, as described below. Alternatively, the detector may be provided with at least one segment portion. The electrode elements may be separated both radially and angularly or in any other convenient manner.

Each portion may have a separate signal read-out. The detector being separated into portions, e.g. annular portions or sector portions, is beneficial in that it allows more information to be obtained in relation to the signal particles detected. Thus, providing the detector 405 with multiple portions may be beneficial in obtaining additional information relating to the detected signal particles. This can be used to improve the signal to noise ratio of the detected signal particles. However, there is an additional cost in terms of the complexity of the detector.

As shown in FIG. 6A, the detector, in which an aperture 406 is defined and configured for the through passage of a charged particle beam, comprises inner detecting portion 405A and outer detecting portion 405B. The inner detecting portion 405A surrounds the aperture 406 of the detector. The outer detecting portion 405B is radially outwards of the inner detecting portion 405A. The shape of the detector may be generally circular. Thus, the inner detecting portion and the outer detecting portion may be concentric rings. In an example, the detector may be divided into two (or more) concentric rings, for example, as depicted in FIG. 6A.

Providing multiple portions concentrically or otherwise may be beneficial because different portions of the detector may be used to detect different signal particles, which may be smaller angle signal particles and/or larger angle signal particles, or secondary signal particles and/or backscatter signal particles. Such a configuration of different signal particles may suit a concentrically zoned detector. The different angled backscatter signal particles may be beneficial in providing different information. For example, for signal particles emitted from a deep hole, small-angle backscatter signal particles are likely to come more from the hole bottom, and large-angle backscatter signal particles are likely to come more from the surface and material around the hole. In an alternative example, small-angle backscatter signal particles are likely to come more from deeper buried features, and large-angle backscatter signal particles are likely to come more from the sample surface or material above buried features.

FIG. 8 is a schematic diagram of an exemplary charged particle-optical system, for example an assessment tool, having the charged particle device as in any of the above described options or aspects. The charged particle device is configured to project a beam of charged particles onto a sample. The charged particle optical device having at least the objective lens array 241 as described in any of the aspects or embodiments above may be used in the charged particle-optical system as shown in FIG. 8. For conciseness, features of the objective lens array 241 that have already been described above may not be repeated here.

There are some considerations specific to the setup of FIG. 8. In the present embodiment, it is preferable to keep the pitch small so as to avoid negatively impacting throughput. However, when the pitch is too small, this can lead to cross-talk. Therefore, the pitch size is a balance of effective detection of a selected signal particle such as a backscatter signal particle and throughput. Thus, the pitch is preferably approximately 300 µm in such an arrangement for detection of backscatter signal particles, which is 4-5 times larger than it might otherwise be for the embodiment of FIG. 8 when detecting secondary signal particles. When the distance between the detector and the sample 208 is reduced, the pitch size can also be reduced without negatively affecting the cross-talk. Therefore, providing the detector as close as possible to the sample (i.e. with distance L as small as possible, and preferably less than or equal to approximately 50 µm, or less than or equal to approximately 40 µm, or less than or equal to approximately 30 µm, or less than or equal to approximately 20 µm, or equal to approximately 10 µm), is beneficial in allowing the pitch to be as large as possible which improves throughput.

As shown in FIG. 8, the charged particle-optical system comprises a source 201. The source 201 provides a beam of charged particles (e.g. electrons). The multi-beam focused on the sample 208 is derived from the beam provided by the source 201. Sub-beams 211, 212, 213 may be derived from the beam, for example, using a beam limiter (which may otherwise be referred to as a beam limiting aperture array) defining an array of beam-limiting apertures. The beam may separate into the sub-beams 211, 212, 213 on meeting the control lens array 250. The sub-beams 211, 212, 213 are substantially parallel on entry to the control lens array 250. (In an arrangement, the control lens array 250 comprises the beam limiter.) The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 collimates the beam from the source such that beam cross-section is substantially consistent on incidence with the beam limiter. The macro collimator 270 bends respective portions of the beam from which the sub-beams are derived by an amount effective to ensure that a beam axis of each of the sub-beams is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro-collimator may be partially or wholly replaced by a collimator element array provided down-beam of the upper beam limiter. Each collimator element collimates a respective sub-beam. The collimator element array may be formed using MEMS manufacturing techniques so as to be spatially compact. The collimator element array may be the first deflecting or focusing charged particle-optical array element in the beam path down-beam of the source 201. The collimator element array may be up beam of the control lens array 250. The collimator element array may be in the same module as the control lens array 250.

In the embodiment of FIG. 8 a macro scan deflector 265 is provided to cause sub-beams to be scanned over the sample 208. The macro scan deflector 265 deflects respective portions of the beam to cause the sub-beams to be scanned over the sample 208. In an embodiment, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the embodiment shown, the macro scan deflector 265 is provided between the macro collimator 270 and the control lens array 250.

In another arrangement (not shown), the macro scan deflector 265 may be partially or wholly replaced by a scan deflector array. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In an embodiment, the scanning deflectors described in European patent application publication no. EP2425444, which is incorporated herein in its entirety by reference and at least specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array 260 together, preferably in synchronization.

Embodiments of the invention can be applied to various different tool architectures. For example, the charged particle beam tool 40 may be a single beam tool, or may comprise a plurality of single beam columns or may comprise a plurality of columns of multi-beams (i.e. sub-beams). The columns may comprise the charged particle optical device described in any of the above embodiments or aspects. As a plurality of columns (or a multi-column tool), the devices may be arranged in an array which may number two to one hundred columns or more. The charged particle device may take the form of an embodiment as described with respect to and depicted in FIG. 3 or as described with respect to and depicted in FIG. 8, although preferably having an electrostatic scan deflector array and/or an electrostatic collimator array for example in the objective lens array assembly. The charged particle optical device may be a charged particle optical column. A charged particle column may optionally comprise a source.

As described above, the array of detectors 240 may be provided between the objective lens array 241 and the sample 208, as shown in FIG. 4 and FIG. 5. The array of detectors 240 may be associated with at least one electrode of the objective lens array, preferably, the lower electrode 243. Preferably, the down-beam array of detectors 240 faces the sample 208 in use, i.e. when the sample is present.

Additional or alternative detector arrays may be provided which may be positioned in other places. This is depicted in FIG. 7. One, some or all of the detector arrays as shown in FIG. 7 might be provided. If multiple detector arrays are provided, they may be configured to detect signal particles simultaneously. The detector array 240 positioned between the objective lens array 241 and the sample 208 is shown as a zoned detector as described in relation to FIGS. 6A and 6B. However, any appropriate type of detector may be used for this array.

The charged particle-optical device may comprise an array of detectors, referred to herein as an array of mirror detectors 350. The array of mirror detectors 350 is arranged along the primary beam paths 320 (e.g. at a common position along the primary beam path). The array of mirror detectors 350 is configured to face up-beam of the primary beam paths 320. In other words, the array of mirror detectors 350 is configured to face along the primary beam path 320 towards a source of the primary beam (described above as source 201). The array of mirror detectors 350 is configured to face away from the sample 208. The array of mirror detectors 350 may otherwise be referred to as an upwards array of detectors. Preferably, the array of mirror detectors 350 is associated with the lower electrode 243, and preferably an up-beam surface of the electrode. This may be beneficial as the signal particles may be more likely to be detected if the array of mirror detectors 350 are provided relatively close to the sample 208, e.g. just above or on the lower electrode 343. When the array of mirror detectors 350 is positioned within the objective lens array 241 (i.e. between electrodes of the objective lens array 241) it may be referred to as an in-lens detector. In an arrangement of an objective lens array assembly with multiple lensing electrodes, other electrodes may feature a mirror electrode, so long as another electrode is located up beam of the mirror electrode to mirror the signal particles towards the mirror electrode.

The charged particle-optical device may comprise at least one up-beam array of detectors facing towards the sample, i.e. in the direction of the sample 208. In other words, the up-beam array of detectors may be facing in a direction along the primary beam path 320 towards the sample 208. The charged particle-optical device may comprise upper array of detectors 370. The upper array of detectors 370 may be associated with the down-beam surface of the upper electrode 242 of the objective lens array 241. More generally, the upper array of detectors 370 could be associated with a down-beam surface of any appropriate electrode if more electrodes are provided in the objective lens array. The upper array of detectors 370 may be positioned between the upper electrode 342 and the lower electrode 343, or between any other electrodes above the lowest electrode of the objective lens array. As described above, the upper array of detectors 370 is provided up-beam (in relation to the primary sub-beams 211 and 212) of at least one electrode, which is the lower electrode 243 in relation to FIG. 7. Additionally or alternatively, the charged particle-optical device may comprise an above-lens array of detectors 380. In other words, the up-beam array of detectors may be above the objective lens array 241. The above-lens array of detectors 380 may be up-beam of all the electrodes forming the objective lens array 241. The above-lens array of detectors 380 may be spaced apart from the electrode 242 so that the above-lens detector array 380 is a plate or substrate with its own mechanical support separate from the objective lens array.

Any of the detector arrays may be associated with (e.g. in, on, positioned adjacent to, connected to, or integrated with) at least one electrode of the objective lens array 241 (e.g. either the upper electrode 242 or the lower electrode 243). For example, the array of detectors may be in or on at least one electrode of the objective lens array 241. For example, the array of detectors may be positioned adjacent to one of the electrodes. In other words, the array of detectors may be positioned in close proximity and next to one of the electrodes. For example, the array of detectors may be connected (e.g. mechanically connected) to one of the electrodes. In other words, the array of detectors may be attached to one of the electrodes, e.g. by adhesive or welding or some other attachment method. For example, the array of detectors may be integrated with the one of the electrodes. In other words, the array of mirror detectors may be formed as part of one of the electrodes.

Combinations of the detector arrays may be provided. For example, the down-beam array of detectors 240 and/or the array of mirror detectors 350 and/or the upper array of detectors 370 and/or the above-lens array of detectors 380 may be provided. The device may comprise an additional array of detectors which may be provided with any combination of the down-beam array of detectors 240 and/or the array of mirror detectors 350 and/or the upper array of detectors 370 and/or the above-lens array of detectors 380. As will be clear from the above described combinations of arrays, there could be any appropriate number of detector arrays. For example, there could be two, or three, or four, or five, or more arrays of detectors which are positioned at any appropriate place, for example, as described above in relation to the up-beam array of detectors and/or the down-beam array of detectors. Whichever detector arrays are provided may be used simultaneously. A potential of any of the detector arrays (e.g. the array of mirror detectors 350 and/or the upper array of detectors 370 and/or the above-lens array of detectors 380 and/or the down-beam array of detectors 360 and/or any additional array of detectors) relative to a potential of the sample 208 may be selected to control detection of the signal particles at least that detector array. The array of sub-beams (otherwise referred to as an array of primary beams) may correspond with any/all detector arrays provided. Thus, the array of sub-beams may correspond with the array of mirror detectors 240, and/or the down-beam array of detectors 360, and/or the upper array of detectors 370 and/or above-lens array of detectors 380. Thus, any/all of the detector arrays may be aligned with the sub-beams.

FIG. 9 is a schematic diagram of an exemplary single beam charged particle beam tool 40 according to an embodiment. As shown in FIG. 9, in an embodiment the charged particle beam tool 40 comprises a sample holder 207 supported by a motorized stage 209 to hold a sample 208 to be inspected. The charged particle beam tool 40 comprises an charged particle source 201. The charged particle beam tool 40 further comprises a gun aperture 122, a beam limit aperture 125 (or beam limiter), a condenser lens 126, a column aperture 135, an objective lens assembly 132, and a charged particle detector 144 (which may otherwise be referred to as an electron detector). The objective lens assembly 132, in some embodiments, may be a modified swing objective retarding immersion lens (SORIL), which includes a pole piece 132*a*, a control electrode 132*b*, a deflector 132*c*, and an exciting coil 132*d*. The control electrode 132*b* has an aperture formed in it for the passage of the charged particle beam. The control electrode 132*b* forms the surface facing the sample 208. Although the charged particle beam tool 40 shown in FIG. 9 is a single beam system, in an embodiment a multi-beam system is provided. Such a multi-beam system may have the same features as shown in FIG. 9, such as the objective lens assembly 132. Such a multi-beam system may have in addition beam limiter array, for example down-beam of the condenser lens, for generating the sub-beams. Associated with the beam limiter array, such as down beam of the beam limiter array, may be a number of charged particle array elements such a deflector array and a lens array for optimizing and adjusting the sub-beams and reducing aberrations of the sub-beams. Such a multi-beam system may have a secondary column for detecting signal charged particles. A Wien filter may be up-beam of the objective lens assembly to direct the signal particles towards a detector in the secondary column.

In an imaging process, a charged particle beam emanating from the source 201 may pass through the gun aperture 122, the beam limit aperture 125, the condenser lens 126, and be focused into a probe spot by the modified SORIL lens and then impinge onto the surface of sample 208. The probe spot may be scanned across the surface of the sample 208 by the deflector 132c or other deflectors in the SORIL lens. Signal particles emanated from the sample surface may be collected by the charged particle detector 144 to form an image of an area of interest on the sample 208.

The condenser and illumination optics of the charged particle beam tool 40 may comprise or be supplemented by electromagnetic quadrupole charged particle lenses. For example, as shown in FIG. 9 the charged particle beam tool 40 may comprise a first quadrupole lens 148 and a second quadrupole lens 158. In an embodiment, the quadrupole lenses are used for controlling the charged particle beam. For example, first quadrupole lens 148 can be controlled to adjust the beam current and second quadrupole lens 158 can be controlled to adjust the beam spot size and beam shape.

As described above, a zoned detector may have a plurality of detector portions (e.g. sensor elements) as part of a detector element 405 as described above in relation to FIGS. 6A and 6B. The plurality of detector portions for each detector element (or sensor unit) is provided around an aperture. The plurality of detector portions may, together, have a circular perimeter and/or a diameter. The plurality of detector portions may, together, have an area extending between the aperture and the perimeter of the plurality of detector portions. The pluralities of detector elements may be arranged in rectangular array or a hexagonal array. The signal generated from signal particles captured by detector portions surrounding one aperture may be combined into a single signal or used to generate independent signals. The surfaces of the detector elements, optionally their detector portions, may substantially fill the surface of the substrate supporting the detector elements.

Figure 10A:
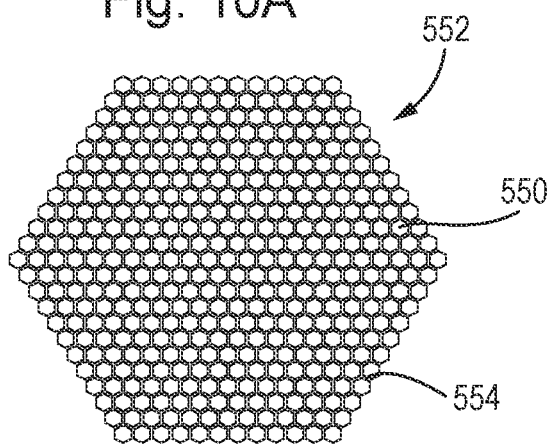
FIGS. 10A, 10B and 10C are schematic representations of a detector array and an associated cell array according to an embodiment, a schematic representation of a cell of the cell array, and a cell of the cell array according to an embodiment.

As shown in FIG. 10A a surface of a detector array or detector module facing, even proximate in use to, a sample features an array of detector elements (or an array of detectors). Each detector element is associated with an aperture. Each detector element is associated with an assigned surface area of the substrate of the detector module. As the substrate is layered, for example in having a CMOS structure, each layer within the substrate is positioned with respect to the respective detector elements, preferably proximately. Commercially available CMOS structures have a usual range of layers, for example three to ten, usually about five. (For example, two functional layers may be provided for ease of description. These two layers of wiring layer and logic layer may represent as many layers as required and each layer is not restricted to wiring or logic, respectively.) The number of layers is limited by commercial availability and any number of layers is feasible. However, in view of practicality, the substrate has a limited number of layers, in order for an efficient design the available space is limited.

Ideally a circuit layer of the substrate, which can be the wiring layer and/or logic layer, has a portion assigned for each detector element (or detector). The assigned portions of the different layers may be referred to as a cell 550. The arrangement of portions in the substrate for the full multi-beam arrangement may be referred to as a cell array 552. The cells 550 may be same shape as the surface area assigned for each detector element, such as hexagonal, or any reasonable shape that may tesselate and may all be similar in shape and/or area, such as a rectangular shape. Having a rectangular or rectilinear shape can more readily be used by placing and routing design. Such design is commonly implemented by software that is suited to define chips with a rectangular type architecture with orthogonal directions, than architecture requiring acute or obtuse angles such as in a hexagonal architecture. In FIG. 10A the cells 550 are depicted as being hexagonal and the cell array 552 is depicted as a hexagon comprising individual cells. However, ideally each similarly located with respect to detector elements. Wiring routes 554 may connect to each cell 550. The wiring routes 554 may be routed between other cells of the cell array 552. Note: reference to wiring routes to be between cells of the array, it is intended that at least the wiring routes avoid the beam apertures of the array of apertures, e.g. defined through the cell array. In an arrangement circuit architecture, the cell size in at least the circuit layer may be reduced to accommodate the wiring routes, so that the wiring routes are routed between cells. Additionally or alternatively the wiring routes pass through the cells of the cell array, preferably towards the perimeter of the cells for example to reduce the interference of the wiring routes with other circuitry in the cells. Therefore reference to a wiring route between the cells encompasses: a wiring route between the circuitry of cells, a wiring route within cells, preferably towards the periphery of the cells and at least around the beam apertures through the cells and any intermediate variation. In all these arrangements, for example in a CMOS architecture, the wiring routes may be in the same die as the other circuitry which may define circuitry in the same cell as a portion of the wiring route, or circuitry in a cell around which the wiring route is routed. Thus, the cells and wiring routes may parts of a monolithic structure. The wiring routes 554 may signally connect the cells. Thus the wiring routes signally connect the cells 550 to a controller or data processor external to the cell array or even the substrate or detector module. The circuit layer may comprise a datapath layer for the transmission of sensor signals from a cell outward of the cell array.

The controller or data processor may before circuitry within the substrate or detector module, preferably external to the cell array for example as control and I/O circuitry (not shown). The control and I/O circuitry may be in the same die as the cell array; the control and I/O circuitry may be monolithically integrated with the cell array, for example in the same CMOS chip. The control and to I/O circuitry enables an efficient connection between the data from all the cells of the cell array 552. Consider for example an arrangement of 2791 cells each having an 8 bit digital output. Such an arrangement would have 22328 signals (i.e. 8 bit output*2791 cells) to the electronics located outside the CMOS chip. The standard way of doing this is to use a SERDES circuitry (serializer/de-serializer). Such circuitry would transform a large number of low data rate signals into a few number of high data rate signals by means of time division multiplexing. It is therefore beneficial to have control and I/O circuitry monolithically with the cell array, or at least in the detector module, than external to the detector module.

In embodiments the control and I/O circuitry may feature general supporting functions, such as circuitry to communicate with the electronics outside the CMOS chip to enable loading certain settings, for example for control of amplification and offset such as subtraction as described herein.

Figure 10B:
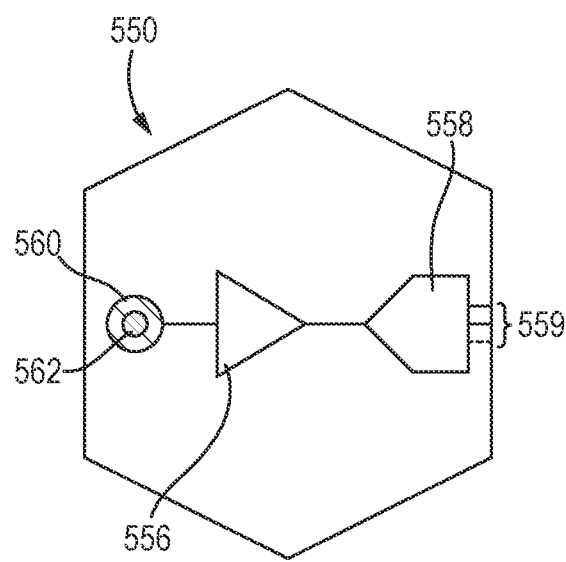

The circuit layer of a cell 550 is connected to a detector element of the respective cell. The circuit layer comprises circuitry having amplification and/digitation functions, e.g. it may comprise an amplification circuit. A cell 550 may comprise a trans impedance amplifier (TIA) 556 and an analogue to digital converter (ADC) 558 as depicted in FIG. 10B. This figure schematically depicts a cell 550 with an associated detector element such as capture electrode and a feedback resistor 562 connected to the transimpedance amplifier 556 and the analogue to digital converter 558. The digital signal lines 559 from the analogue to digital converter 558 leave the cell 550. Note that the detector element is represented as a detector element 560 and feedback resistor is shown associated with the detector area as a disc 562 rather than associated with the transimpedance amplifier 556. This schematic representation is to represent each of the detector element and the feedback resistor as an area to indicate their relative size, the reason for which will become apparent when referring to FIG. 10C.

The transimpedance amplifier may comprise a feedback resistor Rf 562. The magnitude of the feedback resistor Rf should be optimized. The larger the value of this feedback resistor, the lower the input referred current noise. Thus the better signal-to noise ratio at the output of the transimpedance amplifier. However, the larger the resistance, Rf, the lower the bandwidth. A finite bandwidth results in a finite rise and fall time of the signal, resulting in additional image blur. An optimized Rf results in a good balance between noise level and additional image blur.

To implement the design the circuitry i.e. the amplification circuitry associated with each detector element should be within the layers of the associated cell 550 and fit in the limited area available of the portions of each associated layer. In the case of a sub-beam pitch of 70 microns, the available area per layer in the cell is typically only 4000 square microns. Depending on the sensed secondary and/or backscatter signal particles, for example as current to be measured by the detector element, the optimum value for the feedback resistor Rf can be as high as 30 to 300 MOhm. If such a resistor would be implemented as a poly resistor in a standard CMOS process the size of such resistor would be much larger than the area that is available in the CMOS layers of the cell 550. For example, a resistor of 300 MOhm would consume around 500000 micron^2. This is about 130 times larger than the entire available area.

Typically, for example in CMOS architecture, such a large resistor would be made in a single layer for example of polysilicon. Usually there is a single layer of polysilicon. In some circumstances a layer could be provided having material capable of providing high resistor values, although with such a high aspect ratio (e.g. extreme length relative to width of the resistive structure in the layer) the reliability of the resistor remains. Even if the cell were to have multiple layers used for such a resistor, many more layers would have to be present that is readily available for example using CMOS technology. Additionally or alternatively, the meandering path through different layers would not mitigate the high aspect ratio and risk of variation in the resistance value would only be contributed by the interconnections between different layers. Such interconnects influence the variability of the resistance value of a resistor as a corner, as later described herein.

Note that such dimensions are calculated assuming a 180 nm node architecture and processing. If alternatively a smaller processing node is used, it is unlikely that a factor of thousand in reducing the dimensions of the resistor structure could be gained. Further, using 180 node architecture is preferred to a smaller node for processing reasons. For instance interconnects in a 180 nm node are simpler to process. Post processing of a detector chip for example in etching the beam apertures 504 uses aluminum interconnects. Such post processing at a sub-180 nm node typically uses a process with Copper interconnects. Processing at 180 nm is therefore simpler than at sub-180 nm.

Further if such a resistor were made, in whichever node, the reliability of the resistor specifications as well as the space available for the resistor may be challenging.

In a layered structure for chip architecture, such as CMOS, the components and features are defined as structures in a layer. The specification of a component is dependent on the material of the layer and the physical properties of the layer, the dimensions of the layer, specifically its thickness and the dimensions of the structure formed in the layer. A resistor may take the form of a long narrow path, route or wire. In view of space constraints, the path may be non-linear, having corners along its path. For such a long component, the width of the path in the layer may vary such as through manufacturing tolerances. A corner may provide greater variance than a linear section of the path, limiting the accuracy with which the resistor can be made in order to have a specified resistance. With many corners and a long length, a resistor having such topology may made with poor reliability so that the resistances for equivalent resistors in different cells of the cell array may have a large range.

Such a resistive structure has a large surface area. Additionally or alternatively, a resistor with such a large surface area would additionally have a capacitance which is undesirable; such a capacitance is referred to as a parasitic capacitance. Parasitic capacitances may undesirably contribute to noise and blur, influencing the balance between noise, blur and bandwidth optimization which is elsewhere herein described The material properties of the layer can be modified chemically; however such modifications are unlikely to achieve the improvement of several orders of magnitude in size to fit into available space in the cell. Such modifications are unlikely to change the topography of the feedback resistor sufficiently so that it has the required specification and can be made with the desired reliable accuracy.

Such requirements in reliability and size would enable the resistor to achieve its desired performance in terms of bandwidth, signal to noise ratio, and stability. Unfortunately, these requirements cannot be met.

Figure 11:
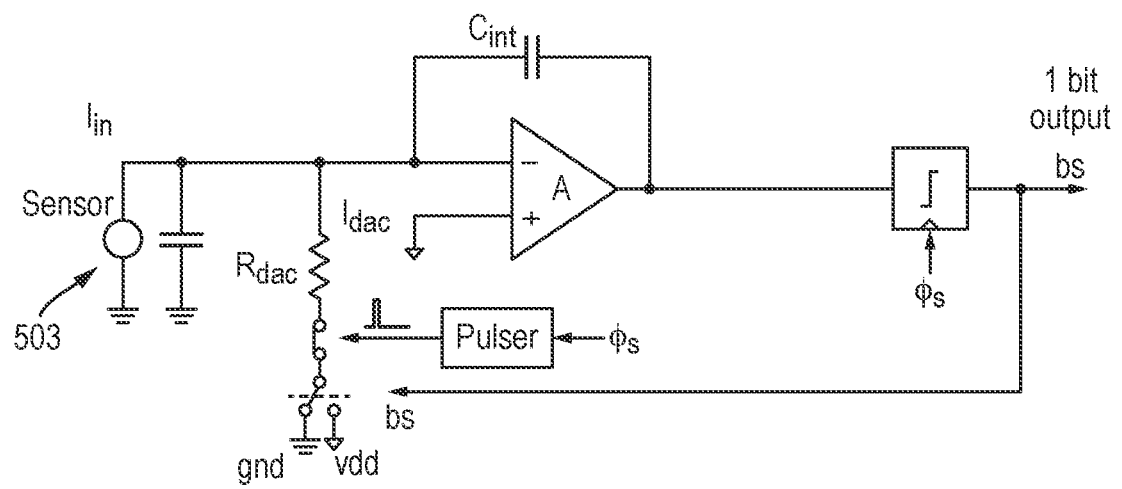
FIG. 11 is a circuit diagram of another exemplary amplification circuit according to an embodiment.
Figure 12:
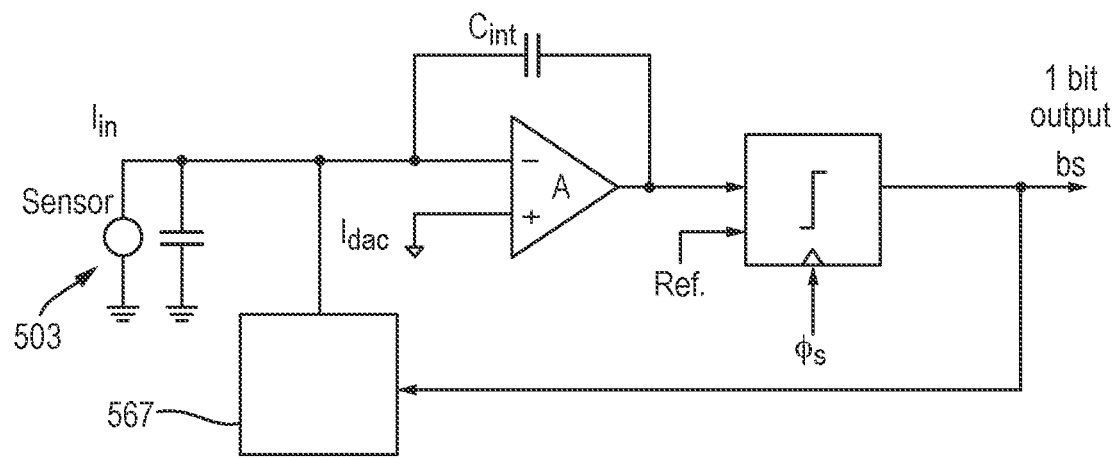
FIG. 12 is a circuit diagram of another exemplary amplification circuit according to an embodiment.

Alternative amplification circuitry is proposed which does not require such a large feedback resistor. Examples include a trans impedance amplifier with a pseudo resistor as a feedback element and a direct analogue to digital converter, obviating the need for a transimpedance amplifier. Two examples of a direct analogue to digital converter are: using a low duty cycled switched resistor, FIG. 11, and using a reference capacitor, FIG. 12. An optional arrangement is to remove the analogue to digital converter 558 from the cells 550 so that a circuit wire 570 connects the trans impedance amplifier 556 in the cell 550 with the analogue to digital converter external to the cell array 552, FIG. 10C. The arrangement depicted in FIG. 10C may be applied to an amplifier circuit, e.g. as depicted in FIGS. 11 and 12. Each option is now mentioned in turn. The example amplifier circuits described are just some of the suitable types of amplification circuitry that can be used. Other amplifier circuits may exist which achieve similar benefits to those described herein and which use similar circuit architecture for each cell as herein described.

An alternative amplification circuit is a direct analogue to digital converter for example using a switched resistor or capacitor, as depicted in FIGS. 11 and 12 that are connected directly to the output of a detector elements 503. A suitable type of direct analogue to digital converter is a charge-balancing direct current-to-digital converter. Using a direct analogue to digital to converter avoids using a trans impedance amplifier and having the feedback resistor Rf or an exotic alternative. Removing the transimpedance amplifier removes the most power consuming component in the amplification circuit and the main source of input noise. Delta/sigma modulators provide the best realization of charge-balancing direct current-to-digital converter. The two possible solutions are depicted in FIGS. 11 and 12 are: using as a reference a low duty cycle switched resistor; and using as a reference a switched capacitor. These circuits are exemplary and other suitable circuits may exist A suitable direct current-to-digital converter with low duty cycle switched resistor, is depicted in simplified form FIG. 11. The circuit has an integrator A to which is input the output from the detector elements 503 and the reference resistor $R_{dac}$. A capacitor $C_{int}$ is in a feedback loop of the integrator A. The signal output from integrator A is processed by a comparator to for the final step of converting the analogue signal to a digital signal. A bit stream bs provides a feedback from the output of the comparator to a control switch for the reference current $I_{dac}$ using a charge balance loop. The design of control switch helps to ensure a long-term stable balance between the sensor current $I_{in}$ and the reference current $I_{dac}$. This helps ensure that the integrator will not clip its output signal and output bit stream, bs, is a digitised version of the sensor current $I_{in}$ In using such direct current-to-digital converter with low duty cycle switched resistor the size of a reference resistor $R_{dac}$ is reduced, for example in realizing it a CMOS circuit. This is achieved by connecting the reference resistor $R_{dac}$ to the input of the integrator A for a very small portion t of the clock period $T_{clock}$. This results in a small duty cycle: $t/T_{clock}$, e.g. 1:1000. This short connection time is sufficient to deliver the charge in reference current $I_{dac}$ to balance the charge delivered in the current $I_{in}$ from the detector element, i.e. the sensor current. Providing a reference current in this way to balance the sensor current helps to ensure that the reference noise is small. Yet, using such a low duty cycle enables the same effect that would otherwise be achieved by a large resistor such as the feedback resistor $R_f$ of a standard trans impedance amplifier. So this solution applies a smaller sized resistor than would otherwise be used and using the duty cycle to boost its effective size yet minimizing the actual size of the resistor and the effective area of the circuit layer in a cell for this type of amplification circuit.

A suitable direct current-to-digital converter with a reference capacitor is depicted in simplified form in FIG. 12. The circuit has exactly the same features as the current-to-digital converter with low duty cycle switched resistor as depicted in FIG. 11, unless otherwise specified. A capacitive digital-to-analog converter 567 arranged in a switched configuration supplies the reference current. Such a switched capacitor digital-to-analog converter contains at least one capacitor and may contains a parallel capacitor network. Individual capacitors are connected or disconnected with switches based on the input. As a capacitor based circuit, the capacitive digital-to-analog converter 567 may be represented as reference capacitor $C_{dac}$. Instead of a reference resistor $R_{dac}$, a reference capacitor $C_{dac}$ is used. Because a capacitor is used, selection of an appropriately sized capacitor will generate a suitable reference current $I_{dac}$, so that a pulse powered by a clock signal fs to the reference circuit is not required. In restricting the use of the clock to the integrator, the effect of clock jitter is minimized. The effect of the reference current $I_{dac}$ on the sensor current $I_{in}$ is to quantize the signal of the sensor current. This is in effect direct digital conversion.

Figure 10C:
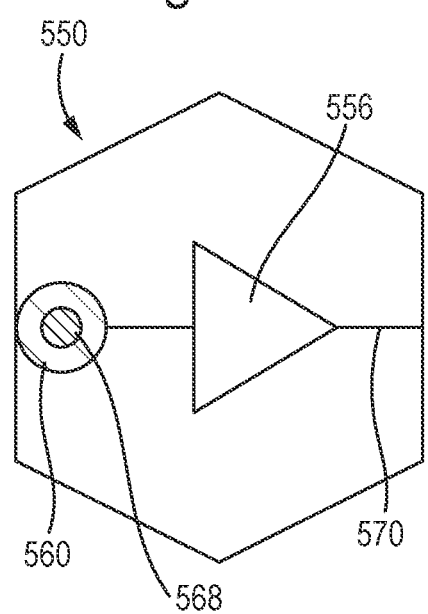

As depicted in FIG. 10C, a cell 550 comprises a transimpedance amplifier 556 connected to a detector element 560. Associated with this amplification circuitry is an effective feedback resistor 568. The output of the transimpedance amplifier is connected to an analogue to digital converter 558 (not shown) which is remote from the cell. A circuit wire 570 connects the trans impedance amplifier and the analogue to digital converter. The circuit wire 570 transmits an analogue signal. Considering that cell array 552 is densely packed, the analogue to digital to converter is external to the cell array for example one the same die as the cell array 552 and/or monolithically integrated with the cell array 552. In an embodiment the analogue to digital converter 558 is in the substrate of the detector module. Alternatively the analogue to digital converter is remote from the substrate, for example it is part of a processor external to the substrate.

The differences in components between the cells depicted in FIGS. 10B and 10C are that the cell of FIG. 10C only includes a trans impedance amplifier and not an analogue to digital convert and the circuit wire 270 transmits an analogue signal rather than the digital signal transmitted by the analogue to digital converter. By removing the analogue to digital converter from the cell 550, there is more space available in the circuit layer of the cell 550 for a feedback resistor element. This relative difference can be noted by the relative size of the feedback resistor areas 562 in FIGS. 10B and 10C; (but note, the relative dimensions do not necessarily apply to other features of these two figures). There is yet more space in the circuit layer of the cell 550 if the amplifier circuitry uses an alternative trans impedance amplifier circuit, for example if a trans impedance amplifier with a pseudo resistor is used as a feedback element.

Although it may be easier to fit the trans impedance amplifier 556 with a pseudo resistor feedback element and analogue to digital converter in the circuit layers of the cell, in an arrangement it is more practical for space constraints for the analogue to digital converter 558 to be external to the cell array 552. This is despite the use of a pseudo resistor in the feedback element of the trans impedance amplifier providing a gain of one to two orders of magnitude in area. One consideration to decide whether or not the analogue to digital converter 558 is external to the cell array 552 is the sub-beam pitch of the multi-beam. For example with a sub-beam pitch of 70 microns, typically only 4000 square microns is available per layer of a cell for the circuitry including the amplification circuitry.

Under such space constraints, a trans impedance amplifier is located in the cell of each beam. The analogue to digital converter is located outside the array of sub-beams, i.e. outside the cell array. In an embodiment, the analogue to digital converter is present on the same die as the cell array, for example monolithically with the cell array. Such an analogue to digital converter may be located with the control and I/O circuitry which may be on the detector module or even monolithic with the cell array 552. Locating the analogue to digital converter external to the cell array may provide an area gain of about a factor of two.

The circuit wire 570 connects the trans impedance amplifier in a cell 550 with the associated analogue to digital converter 558. The circuit wire 570 transmits an analogue signal. Unlike a digital signal, a data path transmitting an analogue signal is susceptible to interference. Signal interference can be from cross-talk with other circuit wires and from external fields such as generated by the sub-beams of the multi-beam and fields from nearby charged particle optical components such as the objective lens array 241.

The circuit wire 570 is routed through the a wiring route 554 as depicted in FIG. 10A. The wiring route 554 is routed between cells so that the area of a cell and its layers is used for the amplification circuitry present on a cell. The wiring route 554 therefore only uses a portion of the circuit layers in which the wiring route is present, namely between adjoining cells 550 (e.g. at least around the beam apertures 504, 406 of the adjoining cells 550; through the adjoining cells 550 such as towards the periphery of the cells or between the circuitry in a layer assigned to the adjoining cells 550, or any arrangement between the stated arrangements). This routing avoids architectural interference of the amplification circuitry and the architecture of the wiring routes 554. Circuit wires are routed along the wiring routes in the cell array in an outward direction, for example in a radially outward direction. With greater proximity to a perimeter of the cell array 552, there may be more circuit wires 570 than in a portion of the wiring route 554 remote from the perimeter. The wiring route may have a plurality of circuit wires 570, which as described, is between cells of the array. Therefore a portion of the wiring route 554 may have more than one circuit wire 570. However, having circuit wires located close to each other risks crosstalk between the circuit wires and interference of the analogue signals transmitted by the circuit wires 570.

Figure 13:
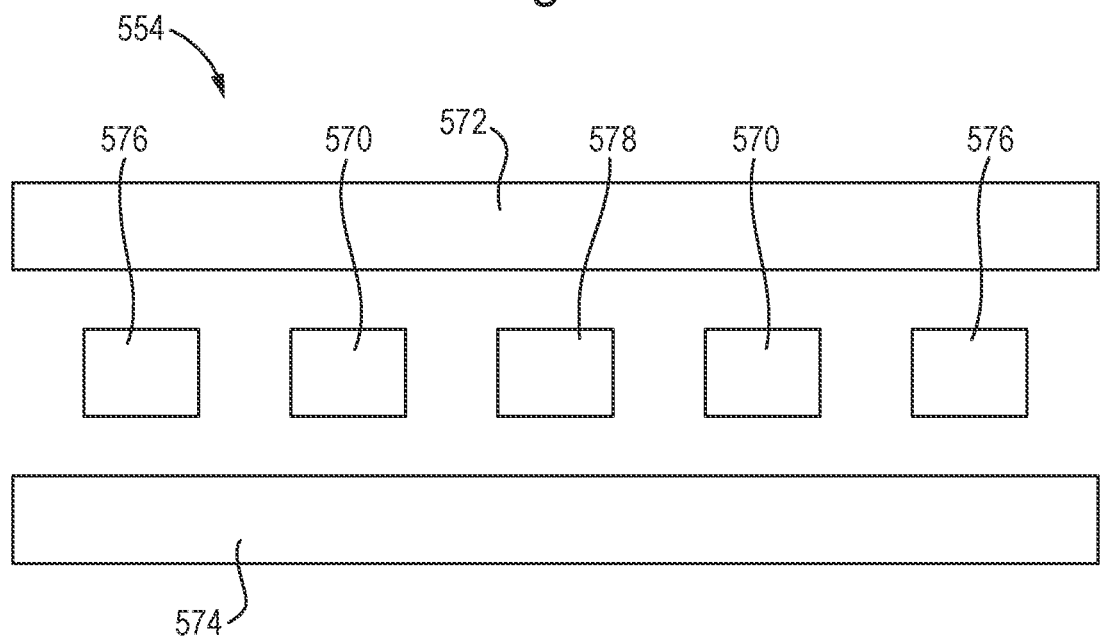
FIG. 13 is a schematic representation of a cross-section wiring route showing circuit wires and a shielding arrangement according to an embodiment.

The risk of crosstalk and signal interference may be at least reduced or even prevented by having the circuit wires 570 shielded from each other within the wiring route. FIG. 13 depicts a cross-section of an exemplary arrangement of wiring route 554. Within the wiring route 554 are one or more circuit wires 470, shown extending in same direction as the wiring route 554 and a shielding arrangement. The circuit wires are shown in the same layer. Above the circuit wires 570 is an upper shielding layer 572; beneath the circuit wires 570 is a lower shielding layer 574. The upper and lower shielding layers of the shielding arrangement shield the circuit wires 570 from fields external to the wiring route 554 above and beneath the wiring route 554. The shielding arrangement has shielding elements in the same layer as the circuit wires 570. The shielding elements may be outer elements 576 at the outer edges of the layer comprising the circuit wires 570. The outer elements 576 shield the circuit wires 570 from fields external to the wiring route 554. The shielding elements may include intermediate shielding elements 578 that are present in the layer between adjoining circuit wires. The intermediate shielding elements 578 may therefore at least suppress if not prevent cross-talk between the circuit wires 570. In operation, a common potential is applied to the shielding layers 572, 574 and shielding elements 576, 578. The potential may be a reference potential for example a ground potential.

Although FIG. 13 depicts a three layer arrangement, as many layers may be used in the wiring route 570 as may be desired. For example, there may be two layers of circuit wires, requiring three shielding layers which include an upper shielding layer 572, a lower shielding layer 574 and an intermediate shielding layer. The intermediate shielding layer may additionally reduce if not prevent crosstalk between the circuit wires in the different layers of the wiring route 570. Thus, there are five layers in total. Every additional layer of circuit wires involves an additional intermediate shielding layer. Whereas increasing the number of layers in the wiring route 554 reduces the proportion of a layer that wire routing requires, such a variation in design involves additional layers. In view of the limited number of layers, there is an optimum number of layers at which the width of the wiring route is reduced without exceeding the number of layers required elsewhere in the substrate of the detector module, which can be limited to five layers.

A further consideration of the design of wiring route is the number of circuit wires that may need to be present in an exemplary design of detector module, for example consider the arrangement of FIG. 13 with all circuit wires 570 in a layer.

For example, an array of sub-beams is arranged a hexagonal array with thirty (30) rings. The detector module therefore has a cell array of corresponding design. The number of cells is around 3000, for example 2791. Assuming such a cell array has a pitch of seventy (70) microns, the innermost cell is a ring of zeroth order, Ring #0, and has a single cell; the innermost ring, Ring #1, is around the central cell; and the outermost ring, Ring N, defines the perimeter of the cell array and consists of 6N cells. For a cell array of thirty rings, the total number of cells equals:

$$N_{cell} := 1 + \sum_{n=1}^{30}(6n) = 2.791 \times 10^3$$

The outermost ring has the highest number of signals that need to be routed through the ring. Considering the wiring route is routed between cells of the each cell, these signals are routed through the outermost ring between the cells of the outermost ring. Because the outermost ring consists of 180 cells (e.g. thirtieth ring multiplied by six, i.e. 30*6=6N), the number of signals transported through the outermost ring, e.g. between the cells of the outermost ring, is:

$$1 + \sum_{n=1}^{29}(6n) = 2.611 \times 10^3$$

The maximum number of signals to be routed through the outer ring between adjacent cells is the total number of signals (2611) divided by the number of cells in the outermost ring (180). This is fifteen 15 (rounded up to the nearest whole number). So that the signals are well shielded, for example to limit crosstalk and the influence of external fields, the wiring route has a shielding arrangement. In a single layer of wire circuits, the layer may have outer elements 576 at the edges of the wiring route and intermediate shielding elements 578 between adjacent circuit wires 570. With a wiring route of fifteen (15) circuit wires 570, there are sixteen shielding elements, including fourteen (14) intermediate shielding elements and two outer shielding elements 576. Therefore between adjacent cells 550 of the outer ring of the example, a wiring route having all circuit wires in the same layer would have thirty-one (31) elements of alternate shielding elements and circuit wires.

For cell array 552 for a beam array with a pitch of 70 microns, there is enough space, or area, available in the circuit layer, for such a wiring route 554. In a structure created using a process at the 180 nm node, the minimum half pitch of a metal layer is typically around 280 nm. In this context a half pitch is a line and a pitch is the line with an associated gap with an adjoining gap. The associated gap is typically the same width the line. The wiring route for thirty-one elements requires thirty-one pitches. However, the associated gap of one of the elements, which corresponds to the outer elements 576, is not part of the wiring route 554, but would separate the wiring route from adjoining circuitry. Therefore, for thirty one elements, sixty-one (61) half pitches are required, which corresponds to a width of the circuit wiring 554 of 17.1 micrometers.

In a different arrangement, the beam array may be hexagonal having 108 rings and around 35000 cells, and may be considered to be a monolithic beam array. The outermost ring has around 650 cells. Around 34350 signals are required to be routed through the outermost ring. So around 54 signals need to be routed through adjoining cells in the outermost ring. A wiring route 554 having 54 circuit wires 570 has 55 shielding elements. Applying a similar calculation as for the previous example in applying this architecture to a half pitch of 280 nm, the width of the circuit wire would be under 61 micrometers. This size would fit between the cells 550 of the outermost ring. In an alternative arrangement the beam arrangement is apportioned in to two or more strips with one or more intermediate strip for routing a support structure, cooling features such as conduits, data transmission lines and the like. Such a beam array may be referred to as a stripped beam array. The wiring routes may therefore be routed through the one or more intermediate strips. This enables a larger beam array, thus cell array yet maintaining a reasonably sized wiring route. If a stripped beam array were to have the same number of sub-beams as a monolithic beam array, the wiring routes would have fewer circuit wires 570 than the monolithic cell array i.e. fewer than 54. Indeed a stripped beam array may achieve a larger number of sub-beams than a monolithic beam array because the size of the beam array, as limited by the maximum number of circuit wires that may be in the wiring route, would be larger The optimization of the noise performance for example in terms of bandwidth and noise optimization and balance between the blur and the noise can be enabled by making sure an amplification factor of the trans impedance amplifier is programmable. In a such an arrangement, the amplifier circuit of the cell, at least the trans impedance amplifier, is programmable. Such a programmable amplification circuit may comprise a variable amplifier and/or a variable analogue to digital converter for example. in terms of its sensitivity. The variable amplifier has a variable amplification range dependent on a detected beam current detected by a detector element 503. For example, when the detected beam current is low, or for a sample with a lower than typical secondary emission coefficient, the variable amplifier can be adjusted to provide a larger amplification than normally used. When a larger beam current than normal is detected by a detector element 503, or for a sample with a larger than typical secondary emission coefficient, the variable amplifier can be tuned to provide a smaller amplification.

This functionality is beneficial with a trans impedance amplifier with a feedback element having pseudo resistor. A pseudo resistor has different effective resistances on application of different applied voltages; unlike an ideal resistor which has a single resistance at all applied potential differences. In providing different resistance, the trans impedance amplifier associated with the pseudo resistor operates as a variable amplification. In providing an amplifier with variable functionality, an optimized balance between noise levels and image blur (referred to herein above as 'additional blur') may be achieved. Beneficially, the programmable amplification circuit may match the output of the trans impedance amplifier with the input of the analogue to digital converter. This may be as a programmable offset that is subtracted between the output of the trans impedance amplifier, and the input of the analogue to digital converter. The programmable offset may help reduce the required number of bits that need to be transmitted from the amplification circuit of a cell. The programmable offset may be implemented in the programmable amplifier. These measures help to ensure that the dynamic range of the trans impedance amplifier and the analogue to digital converter, and thus preferably the amplification circuit, are optimally used for different use cases. Such different use cases may include: the material properties of a sample under inspection, different assessment tool configurations for example using different beam currents. The range of applications may be enabled by the provision of a variable amplifier and a variable off set or threshold (e.g. subtraction by a programmable offset) desirable enables tuning of amplification, threshold and bandwidth As mentioned elsewhere herein, the circuitry associated with variable amplification and subtraction may be comprised in the control and I/O circuitry.

It is beneficial to detect different types of signal particles in order to obtain more varied information relating to the sample. For example, in order to measure an overlay target, one might use secondary signal particles to obtain data relating to a top grating (possibly present in resist) and use backscatter signal particles to obtain data relating to a buried grating.

In some systems, detectors may be provided to be used in different modes, e.g. switching between secondary signal particle detection and backscatter signal particle detection. In order to switch from secondary signal particle detection to backscatter signal particle detection, the electrostatic field between sample and detector is reversed and/or the landing energy is changed. Different sample charging conditions after changing landing energy and/or sample field can cause an overlay measurement error, because these might change the primary beam position. There is a risk the system drifts (sample position and/or beam position) while switching, resulting in an overlay measurement error. Thus, improvements can be made to a system in which detection modes are switched between backscatter detection and secondary detection. European patent application publication no. EP4020516, which is incorporated herein its entirety by reference, discloses such a system and at least the devices and methods relating to switching between different modes are hereby incorporated by reference.

In alternative systems, a detector is provided with a double ring detector pad. The use of a double ring charge-based bottom detector may lead to a considerable amount of cross signals in the rings, i.e. detection of secondary signal particles in the outer ring proposed to detect backscatter signal particles, and detection of backscatter signal particles in the inner ring proposed to detect secondary signal particles. European patent application publication no. EP4020518, which is incorporated herein in its entirety by reference, discloses such a system and at least the devices and methods related to the double ring detector pad are hereby incorporated by reference.

In an implementation, the detection of the two types of detectors is sought to be improved, e.g. by making use of more of, if not the complete, available detection efficiency. The separation of secondary signal particles and backscatter signal particles can be achieved by using the large energy difference between secondary signal particles and backscatter signal particles as described above. Both the secondary signal particles and the backscatter signal particles can be detected at the same time increasing the collection efficiency compared to various known detectors.

Figure 14:
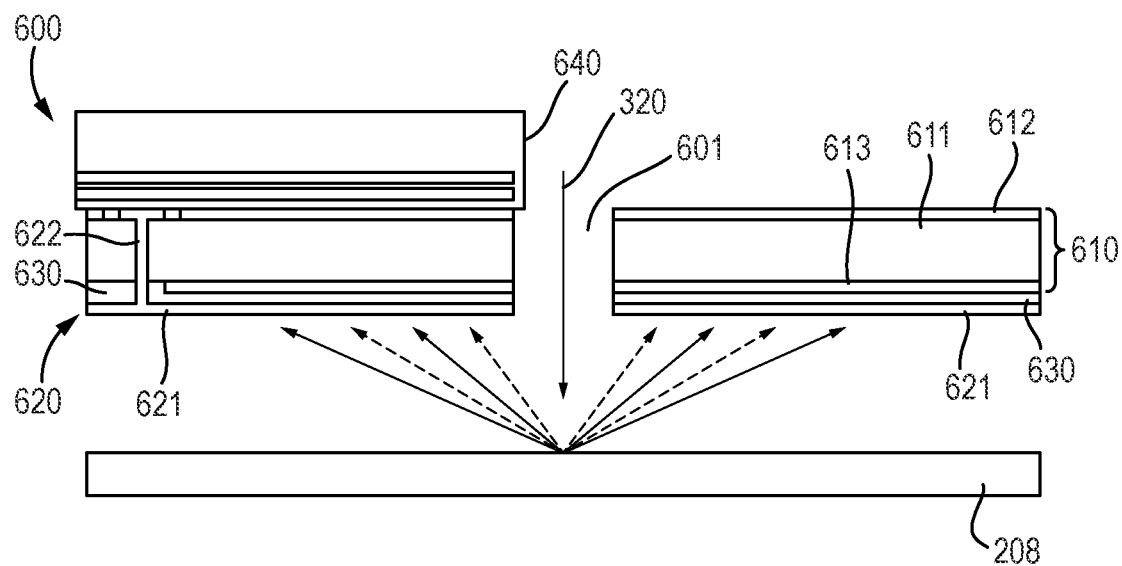
FIG. 14 is a cross-section of a detector according to an embodiment.

In an embodiment, a detector is provided which may be used in a charged particle device for an assessment tool to detect signal particles from a sample. For example, the charged particle device is configured to project a beam of charged particles onto a sample so as to detect signal particles emitted from the sample. An exemplary version of the detector 600 is shown in FIG. 14. The detector 600 comprises a substrate, which may otherwise be referred to as a body. The substrate comprise a semiconductor element 610 (e.g. a pin detector) configured to detect signal particles above a first energy threshold and a charge-based element 620 configured to detect signal particles below a second energy threshold. Resulting signal particles from the sample may comprise signal particles above the first energy threshold and/or signal particles below the second energy threshold. Thus, the detector 600 comprises two different types of detector element, such a first element and a second element. As will be understood from FIG. 14, the detector 600 may be used with a single beam device. Thus, for example, the detector could be used with the single beam device described in relation to FIG. 9 above.

Each different type of detector element may be configured primarily to detect certain signal particles, e.g. those above or below a certain threshold. Signal particles with energies below the first energy threshold are shown with dashed line arrows in FIG. 14 and signal particles with energies above a second energy threshold are shown with solid line arrows in FIG. 14. The first energy threshold may correspond to a backscatter threshold energy. Thus, the semiconductor element 610 (e.g. a first element) may be configured to detect primarily backscattered signal particles. The backscatter threshold energy may the selected lowest energy level of backscattered signal particles that the detector is designed to detect. For example, the backscatter threshold energy may be approximately 50 eV. The second energy threshold may correspond to a secondary threshold energy. Thus, the charge-based element 620 (e.g. a second element) may be configured to detect primarily secondary signal particles. The secondary threshold energy may the selected highest energy level of secondary signal particles that the detector is designed to detect. For example, the secondary threshold energy may be approximately 50 eV. In an arrangement the first element is configured to detect backscattered signal particles and the second element is configured to detect secondary signal particles.

The first energy threshold and the second energy threshold may be substantially the same. Thus, the first energy threshold and the second energy threshold may be a single predetermined value. In this case, the charge-based element 620 may be used to detect any signal particles below the predetermined value and the semiconductor element 610 may be used to detect any signal particles above the predetermined value.

As shown in FIG. 14, the detector 600 may have an aperture 601 defined in the substrate and through which a primary beam 320 may pass to land on the sample 208. This is beneficial in that the detecting elements of the detector 600 can surround the aperture 601 which may increase detection efficiency.

The charge-based element 620 may comprise a metal layer 621. The metal layer 621 may be a planar portion. The metal layer 621 may be a thin film. The charge-based element may have a thickness of approximately 100 nm or less, preferably approximately 10 nm to 100 nm. More specifically, the thickness of the metal layer 621 may be approximately 100 nm or less, preferably approximately 10 nm to 100 nm. Lower energy signal particles with an energy of less than 50 eV (which may correspond to the secondary signal particles described above) can be 'captured' by charge-based elements with a relatively small thickness. Higher energy signal particles have a higher penetration depth. For example, signal particles having an energy of approximately 350 eV may have a penetration depth which is greater than 10 nm to 100 nm. This means that the lower energy signal particles can be captured by the charge-based element 620 and the vast majority of higher energy signal particles will pass through the charge-based element 620. The higher energy signal particles can be detected by the semiconductor element 610. Therefore, such a thickness is beneficial in allowing signal particles to effectively reach the semiconductor element 610. The collection efficiency may be improved by applying a bias between the sample 208 and the detector 600 to attract the signal particles to the detector as described below.

The semiconductor element 610 may be a PIN detector. Scintillators and PIN detectors are typically capable of detecting charged particles above a detection threshold for example typically above approximately 1 kV, although lower values for example 200 eV for PIN detectors are known. For a scintillator, the detection threshold may be varied by the selection of the thickness of a conductive coating, such as a metal layer, on the scintillator surface. The semiconductor element comprises an upper metal layer 612 and a lower metal layer 613 on either side of a p-i-n region 611. The upper metal layer 612 may be a planar portion. The upper metal layer 612 may be a thin film. The lower metal layer 613 may be a planar portion. The lower metal layer 613 may be a thin film. The p-i-n region 611 may otherwise be referred to as a depletion layer or zone. The p-i-n region 611 may comprise a dead layer at the edge of the p-i-n region. The dead layer is an inactive zone or region at the entrance surface of the p-i-n region. The dead layer may comprise a conductive layer, a surface passivation layer and/or an anti-reflective coating. It is possible to have a p-i-n region without the dead layer, however, the dead layer is beneficial in reducing noise. Although a p-i-n region is described throughout, other semiconductor regions may be used instead of the p-i-n region. For example, the semiconductor element may comprise a diffused junction diode, surface barrier detector (e.g. Schottky diode) or an ion-implanted diode.

Preferably, the charge-based element 620 and the semiconductor element 610 are each at least part of layers that are substantially co-planar with the major surfaces of the detector (i.e. the detection surface). The detection surface is the surface of the detector for passage of the signal particles to the semiconductor element 610 and/or the charge-based element 620. It will be understood that the layers of detector elements, such as the charge-based element 620 and the semiconductor element 610 are different portions of the layered detector structure.

In an embodiment, the detector elements may be provided as layers, i.e. layered portions, of a stacked structure comprised in the detector 600 stacked in a thickness direction of the detector. The stacked layers of the charge-based element 620 and the semiconductor element 610 are shown in FIG. 14. The layers of the charge-based element 620 and the semiconductor element 610 are stacked in a direction of the primary beam 320.

Preferably, the charge-based element is closer to the detector surface than the semiconductor element. Specifically, the metal layer 621 of the charge-based element 620 is preferably closer to the detection surface than the semiconductor element, or the metal layer 621 may form the detection surface. Generally, the higher energy signal particles when hitting the detection surface, can be detected at the semiconductor element 610 through the charge-based element 610.

Providing the detector elements stacked on top of each other is beneficial because the detector elements can make use of the complete available detection efficiency by using the full detection area available for the detector 600. In general it is important to separate the secondary signal particles (i.e. the low energy signal particles) and the backscatter signal particles (i.e. the high energy signal particles). This is because typically more secondary signal particles are produced at the sample than backscatter signal particles which causes the secondary signal particles to dominate the signal if the signal particles are not well separated. The stacked detector can separate the signal particles based on the energy difference and the difference in penetration depth. Specifically, the low energy signal particles corresponding to the secondary signal particles are captured by the charge-based element 620. However, the high energy signal particles will penetrate the charge-based element 620 to generate electron-hole pairs in the depletion layer of the semiconductor element 610. Thus, the higher energy signal particles can be detected in the semiconductor element 610 below the charge-based element 620. Thus, the stacked detector allows separate detection of the lower energy signal particles at the charge-based element 620. The stacked detector permits detection of the higher energy signal particles at the semiconductor element 610 simultaneously. These improvements in function are beneficial for improving detection efficiency.

The charge-based element 620 may form the detection surface of the detector. In other words, the charge-based element 620 may be an outermost layer of the detector 600, as shown in FIG. 14. The metal layer 621 may form the detection surface. As shown in FIG. 14, the metal layer 621 may form substantially the whole detection surface.

As shown in FIG. 14, the charge-based element 620 may form a layer (e.g. a coating) over substantially the whole semiconductor element 610. This means that the charge-based element 610 is provided over the whole surface of the semiconductor element 620. In this case, the charge-based element 610 may form substantially the whole detection surface. In particular, the metal surface layer 621 of the charge-based element 620 may form substantially the whole detection surface, as shown in FIG. 14.

The semiconductor element 610 and the charge-based element 620 may be separated from each other. Specifically, the detector may comprise an electrically insulating element 630 between the charge-based element 620 and the semiconductor element 610. The electrically insulating element 630 may be provided as a layer. The electrically insulating element 630 may be a planar portion. The electrically insulating element may be a thin film. The electrically insulating element 630 may be provided in any form or shape. The electrically insulating element 630 is configured to prevent electrical signals passing from the charge-based element 620 to the semiconductor element 610 and vice versa. The electrically insulating element 630 may extend between the charge-based element 620 and the semiconductor element 610. The electrically insulating element 630 may be of any appropriate thickness in order to provide effective electrical insulation. Preferably, electrically insulating element 630 is not too thick to avoid that higher-energy charged particles cannot penetrate it and do not reach the active detector layer 611.

The electrically insulating element 630 may have any appropriate thickness (i.e. in the thickness direction of the detector, e.g. in a direction of the primary beam) between other components, e.g. between the metal layer 621 and the lower metal layer 613. For example, the thickness may be between approximately 10 to 500 nm, and preferably between approximately 50 to 500 nm. It is noted that the electrically insulating element 630 is preferably thick enough to prevent voltage breakdown which depends on the voltage difference between the metal layer 621 and the lower metal layer 613 as in FIG. 14. If the same voltage is used on lower metal layer 613 and metal layer 621 (which should be possible because for the PIN detector functioning only the voltage difference between the upper metal layer 612 and the lower metal layer 613 is important) a thickness of 10 nm could be used, otherwise thickness of 100 nm or more is preferably used. The thickness may depend on the material. The electrically insulating element may be any appropriate material. For example, the electrically insulating element may be $SiO_2$. In this case, the thickness of the electrically insulating element may preferably be between 10 nm to 500 nm, and preferably approximately 100 nm.

The detector may comprise a circuitry layer 640 comprising the detector circuitry. More specifically, the substrate may comprise the circuitry layer 640. The circuitry layer 640 may comprise some, if not all, of the circuitry used to process the signals from the different detector elements. Thus, the circuitry layer 640 may convert the detected signal particles into electrical signals. The circuitry layer 640 may comprise various different electrical components. The circuitry layer may be connected to the charge-based element 620 and the semiconductor element 610 as described below. The circuitry layer may comprise parallel layers of circuitry for connecting to each of the charge-based element 620 and the semiconductor element 610. Alternatively, the circuitry layer may comprise a single layer with circuitry adjacent in cross-section for connecting to each of the charge-based element 620 and the semiconductor element 610.

Providing the circuitry layer 640 in the detector is beneficial in that the circuitry can be close to the detector elements. The detector elements are connected to circuitry to convert the detected signals into a digital signal. In general, having circuitry for converting the detected signal into a digital signal as close as possible to the relevant detector element beneficially improves the digital detection signal. A proximate digitization circuitry reduces risks of loss or at least deterioration of or disruption to the detection signal.

The detector 600 may further comprise an electrically insulated via 622 configured to connect the charge-based element 620, and particularly the metal layer 621, to detector circuitry. That is the electrically insulated via 622 is for the detector to detect a signal particles through connection to the charge-based element. The electrically insulated via 622 may extend through at least part of the semiconductor element 610, as shown in FIG. 14. Thus, the charge-based element 620 may be connected to the circuitry layer 640 by an electrical connection along the electrically insulated via 622. This means that the charge-based element 620 may be used to form the detection surface, or at least part of the detection surface, whilst still being appropriately connected to the circuitry of the detector.

The upper metal layer 612 of the semiconductor element 610 is preferably connected to detector circuitry (preferably comprised in the circuitry layer 640). Additionally, the lower metal layer 613 may be connected to detector circuitry. The detector circuitry may be configured to apply a voltage bias 641 across the upper and lower metal layers of the semiconductor element 610.

As described in further detail below, the circuitry layer 640 may comprise or be connected to the circuit layer and/or wiring as described above in relation to FIGS. 10, 11, 12 and 13. For example, the detector circuitry may comprise a transimpedance amplifier 556 and/or an analog to digital converter 558 connected to the charge-based element 620.

The detector circuitry may comprise a transimpedance amplifier 556 and/or an analog to digital converter 558 connected to the semiconductor element 620. Such a transimpedance amplifier 556 and analog to digital converter 558 (as well as other relevant electrical components) are described above in relation to FIGS. 10A, 10B, 10C, 11, 12 and 13. It is noted that the size available for the detector elements is relatively small. Thus, it is beneficial to provide an amplifier, such as the transimpedance amplifier. However, some amplifiers such as the transimpedance amplifier generally need a large resistance. Thus, the circuitry may be provided with wiring routed between cells as described in relation to FIG. 10A. This allows the signal to be amplified so that the noise is small. Additionally or alternatively, a pseudo resistor may be used with the transimpedance amplifier, and/or an analog to digital converter as described in relation to FIG. 12 or 13.

Although the above describes and shows an electrically insulating element 630 between the semiconductor element 610 and the charge-based element 620, this is not a necessity. For example, the semiconductor element 610 and the charge-based element 620 may be in direct contact with each other. Furthermore, the semiconductor element 610 and the charge-based element 620 may have at least one component in common. For example, the lower metal layer 613 of the semiconductor element 610 may be part of the charge-based element 620. For example, the metal layer 621 forming the detection surface of the charge-based element 620 may also be the lower metal layer 613 of the semiconductor element 610. In such a configuration, good electrical insulation is preferably provided between the circuitry of the detector for the charge-based element and the circuitry of the detector for the semiconductor element. The advantage of the metal layer 621 forming the detection surface of the charge-based element 620 and the lower metal layer 613 of the semiconductor element 610 is that the layer thickness for penetration is smaller (because the separate metal layer 621 and electrically insulating element 630 are not provided), so a greater number of particles reach the p-i-n region. This provides a lower energy threshold for 610. However, it is noted that this configuration may make an accurate charge measurement more difficult.

Although it is described above that the first energy threshold and the second energy threshold are substantially the same, they may have an offset. In other words, the first energy threshold may differ from the second energy threshold. For example, it may be noted that detection of signal particles near the threshold might result in detection of various different types of signal particle and it may be preferable to more clearly separate detection of the different signal particles. Having an offset between the first energy threshold and the second energy threshold may reduce the signal particles detected, and may specifically reduce the amount of signal particles with borderline energy levels which may decease noise in the detection. The first energy threshold may be more than the second energy threshold. The first energy threshold may depend on the layer thicknesses before reaching the p-i-n region. However, it can be tuned somewhat with the bias voltage between the sample and the detector (described further below as the potential different between the sample and detector). If the bias voltage is, for example, +200 V instead of +50 V, then effectively lower backscatter signal particles might gain sufficient additional kinetic energy to pass these layers, thereby lowering the effective first energy threshold. Something similar happens with the second energy threshold. Therefore, the values for the threshold can be influenced by the bias voltage, and therefore the difference between the first and second threshold could be between approximately 0 and 200 V.

It will be understood from the description of the secondary and backscatter signal particles above that the threshold value (e.g. of 50 V, or 100 V, or 200 V) between the different types of signal particles is arbitrary. There is not a black and white division around (i.e. distinct separation at) this threshold. The precise selection of the threshold value is unlikely much to improve or contribute to the image contrast or quality. Thus the selection of the threshold value is unlikely to reduce the detection of signal particles with borderline energy levels. In general it is expected that the effective first and second energy thresholds may be different because of the energy loss in the layers between the charge-based detector 621 and the p-i-n region 611. A signal particle that has just enough energy to leave the charge-based detector 621 (i.e. above the first energy threshold) might lose too much energy in the layers that are in between charge-based detector 621 and the p-i-n region 611 to reach the p-i-n region 611; thus leading to a second energy threshold having a different value from the first energy threshold.

As described above, an aperture 601 is defined in the substrate for the passage therethrough of a charged particle beam. This is beneficial in that the signal beam (e.g. primary beam 320) may pass through the detector 600 such that signal particles can be captured by the detector 600 all the way round the primary beam. However, although this is beneficial, other configurations may also be used. For example, the detector 600 may be provided to one side of the primary beam path. This would allow the primary beam to reach the sample 208, and the detector 600 can still detect signal particles emitted from the sample 208. In this configuration, a Wien filter may be used in combination with the detector. In another arrangement the detector may be provided as at least two portions either side of the path of the primary beam. The two portions may be separated by a gap. The two portions may be spaced apart. The gap may take the form a slit or strip through which the path of the primary beam passes. If multiple primary beams (e.g. sub-beams) are provided, then the detector may still be provided to one or both sides, for example, with slits for paths of the multiple sub-beams of the primary multiple multi-beams. In an arrangement such a detector array may have multiple detectors on one side of the slit. Such an arrangement featuring a slit between detectors or detector portions may be easy to manufacture. However, providing the detector with an aperture formed therein may be beneficial in allowing for a larger detection surface which may thus increase the detection efficiency. Locating the detector on a lens electrode, within an electrostatic lens may be easier to achieve if such a detector has an aperture rather than a slit or the like. It is noted that the aperture of the detector an electrostatic field may cause some disturbance of the field which may affect the primary sub-beam and it is preferable if the disturbance of the sub-beam is symmetric, because it leads to less deformation by aberrations.

Figure 15:
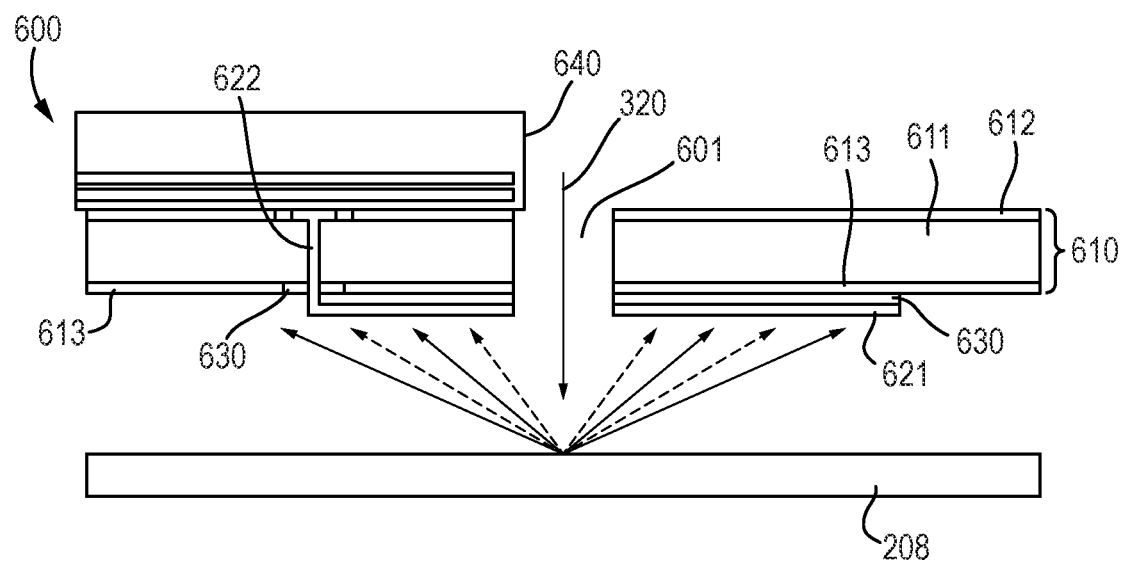
FIG. 15 is a cross-section of a detector according to an embodiment.
Figure 16:
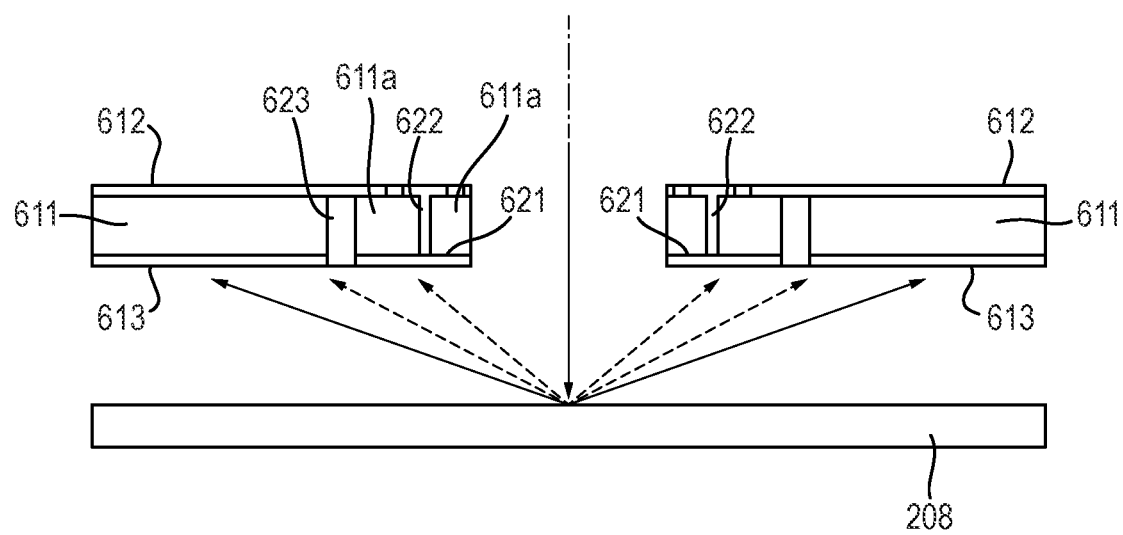
FIG. 16 is a cross-section of a detector according to an embodiment.

The above embodiments and variations may be provided with a slightly different configuration of the charge-based element 620 and the semiconductor element 610, as shown in FIG. 15 and FIG. 16. In this case, the charge-based element 620 may not form substantially the whole detection surface. In this case, the charge-based element 620 provides at least part of the detector surface and the semiconductor element 610 provides at least part of the detector surface. In other words, the detector surface comprises both the semiconductor element 610 and the charge-based element 620.

As would be understood from both FIG. 15 and FIG. 16, the charge-based element 620 and the semiconductor element 610 may be positioned adjacent to each other in plan view. Thus, at least part of the charge-based element 620 may be positioned substantially next to the semiconductor element 610, e.g. on the detection surface, in plan view. It will be noted that a small gap may be provided between the charge-based element 620 and the semiconductor element 610, which may for example comprise electrically insulating material.

FIG. 15 shows an alternative in which the semiconductor element 610 and the charge-based element 620 are stacked, as described above in relation to FIG. 14. Specifically, the semiconductor element 610 and the charge-based element 620 are stacked in cross-section, as in FIG. 14. However, in this embodiment, the charge-based element 620 partially covers the semiconductor element 610. In this instance, the charge-based element 620 may be positioned on part of the semiconductor surface 610, to form part of the detection surface as shown in FIG. 15. In other words, the charge-based element 620 may partially overlap with the semiconductor element 610. Thus, there may be only a partial overlap of the charge-based element over the semiconductor element 610 on the surface of the detector. In this case, the charge-based element 620 may be provided as an additional layer stacked on top of the semiconductor element 610 such that the full semiconductor element is formed beneath the charge-based element 620. Providing the charge-based element 620 in this configuration, i.e. partially covering the semiconductor element 610, may be beneficial for reducing capacitance which might result in a faster detector.

In another instance, the charge-based element 620 may be formed adjacent to the semiconductor element 610, to form part of the detection surface as shown in FIG. 16. In this case, the charge-based element 620 and the semiconductor element 610 are formed adjacent to each other in cross section across the width of the detector (i.e. in a direction orthogonal to the direction of the primary beam, which may otherwise be referred to as a radial direction). In particular, the detecting surface of the charge-based element (provided by metal layer 621) is adjacent to the detecting surface of the semiconductor element (provided by the lower metal layer 613) in cross-section, i.e. the detecting surface of the charge-based element (provided by metal layer 621) is radially outwards or radially inwards of the detecting surface of the semiconductor element (provided by the lower metal layer 613) in cross-section. Thus, the charge-based element does not overlap as a layer stacked on top of the semiconductor element. Instead, the semiconductor element 610 is formed surrounding the charge-based element 620. Specifically, there is no overlap of the charge-based element over the lower metal layer 613. Instead, the lower metal layer 613 surrounds the metal layer 621 of the charge-based element. In other words, the lower metal layer 613 is radially outwards of the metal layer 621 in a plane. The p-i-n layer 611 may be formed through the detector and may be positioned beneath the metal layer 621 of the charge-based element. This is beneficial as the same fabrication processes or process steps may be used for the layers in both the semiconductor element and the charge-based element. As described above, the electrically insulated via 622 may connect the metal layer 621 to the detector circuitry through the p-i-n layer. The semiconductor element may be separated to provide a portion of the p-i-n layer 611a which is associated with the charge-based element 620. The portion of the p-i-n layer 611a associated with the charge-based element 620 does not participate in operation of the semiconductor element 610. The portion of the p-i-n layer 611a associated with the charge-based element 620 may be separated from the rest of the p-i-n layer by insulating part 623. The insulating part 623 may be an electrically insulating member and may be similar to the electrically insulating element 630 described above, albeit with a different configuration. The insulating part 623 may be positioned radially inwards of the semiconductor element 610. The insulating part 623 may be positioned radially outwards of the charge-based element 620.

In this embodiment, the detector elements are operated in different modes. Specifically, the semiconductor element can be used (shown in FIG. 16 as an outer ring) where the energy of higher energy signal particles (such as backscatter signal particles) is converted into electron-hole pairs in a depletion layer just below the surface of the detector. Lower energy signal particles (such as secondary signal particles) will not generally have enough kinetic energy to penetrate the top layer(s) of the detector (consisting of a lower metal layer 613 and a dead layer of the semiconductor). Thus, the lower energy signal particles will not generally be detected by the semiconductor element 620. It is beneficial to remove the lower energy signal particles from the higher energy particle signal. This is because typically more lower energy signal particles are produced at the sample 208 causing the lower energy particles to dominate the higher energy particles if the different signal particles are not well separated. In this configuration, it is expected that the cross-talk of secondary signal particles on the semiconductor element to be very low or zero. The collector efficiency may be slightly lower than the stacked embodiment, due to the reduced overall surface area for both the detection surface of the semiconductor element and the charge-based element.

The charge-based element 620 comprises the metal layer 621 (shown in FIG. 16 as an inner ring) which operates as a charge conductor. This will enable detection of secondary signal particles (and also backscatter signal particles that impact on this inner ring) by their charge. The thickness of the metal layer 621 on the charge-based element may be different than the lower metal layer 613 on the semiconductor element 610 for better charge conduction.

Preferably the metal layer 621 of charge-based element 620 and at least the lower metal layer 613 of the semiconductor element are separated. Preferably the metal layer 621 of charge-based element 620 and at least the lower metal layer 613 of the semiconductor element have electrical isolation between them. There is an isolation layer between the metal layer 621 and the lower metal layer 613. This may be beneficial in avoiding a direct interface between the two layers.

It will be understood that the semiconductor element and the charge-based element could be used to form the detector surface in a number of different configurations. Thus, separation of the detecting portions in the overlapping and/or adjacent configurations described above may be similar to the description in relation to FIGS. 6A and/or 6B above.

For example, the charge-based element 620 and the semiconductor element 610 may each comprise an annulus (e.g. a ring) on the detection surface. The annuli are preferably concentric and radially divided from each other. This is shown in cross section FIGS. 15 and 16. If the charge-based element and the semiconductor element each form a single annulus, it will be noted that in plan view, the detector surface may appear as shown in FIG. 6A. In this instance, the charge-based element may correspond to an inner detecting portion 405A, and the semiconductor element may correspond to an outer detecting portion 405B.

For example, the charge-based element and the semiconductor element may each comprise at least one sector. For example, the detector surface may be formed by multiple sectors, which may be of approximately equal area. The sectors are preferably angularly divided. If the charge-based element and the semiconductor element each form two sectors and the charge-based elements and the semiconductor elements are alternating, it will be noted that in plan view, the detection surface may appear as shown in FIG. 6B. In this instance, the charge-based elements 620 may correspond to detecting portions 405C and 405E, and the semiconductor element 610 may correspond to detecting portions 405D and 405F.

Although not shown, the charge-based elements and the semiconductor elements may comprise at least one sector and at least one annulus. For example, the charge-based element and the semiconductor element may form a checkerboard or dartboard pattern on the detector surface.

The semiconductor element 610 may be provided with multiple annuli. The annuli may be separated, e.g. with some form of electrically insulating member, which may or may not be part of the electrically insulating element 630 and/or insulating part 623. Each semiconductor element annuli may be separated by an insulating part 623, e.g. as shown above in relation to FIG. 16. Providing the semiconductor element 610 as multiple annuli may be beneficial in using an inner annulus to detect smaller angle high energy signal particles and an outer annulus to detect larger angle high energy signal particles. Thus, providing the semiconductor element as at least two annuli allows detection of higher energy signal particles to be separated into different angular ranges if desired.

The detector as described in any of the above variations can work both with decelerating and accelerating objective lenses (i.e. with the device working in a decelerating or an accelerating mode). In particular, when the detector is positioned as a bottom detector (e.g. down-beam of the objective lens array 241), the signal particle trajectories towards the detector are determined by the field between the sample and the detector, not by the decelerating or accelerating field of the objective lens. By applying negative or positive bias on the detector or detector array with respect to the sample, low energy signal particles (e.g. secondary signal particles) can either be repelled (backscatter-only mode) or attracted (combined secondary and backscatter mode). It is noted that higher landing energies are typically used with the accelerating lens. This means that the high energy signal particles (e.g. the backscatter signal particles) have higher energies on average in this case. This makes it easier for the high energy signal particles to pass through the charge-based device 620 and the electrically insulating element 630. The high energy signal particles may thus to reach the semiconductor element 610 in such a layered detector with more ease. This detector type is even more attractive for accelerating lenses.

The detector described above may be used in a single beam device, e.g. in combination with the device described in relation to FIG. 9. Alternatively, the detector could be used in a multi-beam device, e.g. in which a primary beam is separated into sub-beams, for example as described in relation to FIGS. 3 and 8. Thus, multiple detectors may be provided which may be suitable for use in a multi-beam charged particle device. The multiple detectors could be provided as described in any of the above variations or embodiments. The multiple detectors may form an array which may be referred to as a detector array. In this case, each detector may be configured as described above and may be positioned adjacent to other detectors in an array.

Each of the detectors may have the same configuration as each other, e.g. with all the detectors having a detector element configuration as shown in FIG. 14, or the configuration as shown in FIG. 15, or the configuration as shown in FIG. 16.

An array of detectors is shown in FIG. 17 and a variation of the array is shown in FIG. 18. It will be noted that the array of detectors shown in FIG. 17 and FIG. 18 correspond to the detectors described above in relation to FIG. 14. However, the detectors could have any of the above described variations, including those described in relation to FIG. 15 or FIG. 16.

The array of detectors may be arranged in any appropriate configuration. Each detector may correspond to a respective sub-beam 320. For example, the detectors being arranged in an array may correspond in arrangement to the array of sub-beams of the multi-beam array described above. The arrangement may be a hexagonal (see for example FIG. 10A) or rectilinear grid. The detector array may have a plurality apertures formed in the substrate with each aperture formed to correspond to each sub-beam in the multi-beam array. Thus, the apertures of the plurality of detectors may be for the passage therethrough of sub-beams of the multi-beam array towards the sample 208.

If an array of detectors is provided, multiple detectors may be comprised in a substrate which may be referred to as a common substrate. (Thus for an embodiment in which a single detector is present, the detector may be comprised in the substrate). The substrate may comprise a plurality of semiconductor elements 610 and a plurality of charge-based elements 620. Each semiconductor element 610 is associated with a corresponding one of the charge-based elements 620. The same substrate may be provided for all the detectors 600 in the array. Alternatively, multiple substrates may be provided for the detector array, with each substrate comprising a plurality of semiconductor elements 610 and a plurality of charge-based elements 620. The number of semiconductor elements 610 may correspond to the number of charge-based elements 620.

There may be components or layers of detectors which form a common layer, i.e. which are formed in the same position in each detector 600 of the array. For example, one of the components or layers, e.g. the metal layer 621 of the charge-based element, may be formed for each of the detectors in the same position along the primary beam paths. In the case of the metal layer 621, the metal layer 621 may be formed as a detection layer for each of the detectors forming the detector array.

The semiconductor element 610 of each detector may be in a common semiconductor layer of the substrate. Thus, the substrate may comprise a semiconductor detector layer comprising the plurality of semiconductor elements 610. The semiconductor layer may comprise a component common to multiple detectors 600. For example, the p-i-n region 613 of the semiconductor element may be a layer formed across multiple detectors, as shown in FIG. 17. The p-i-n region could be common to multiple, or even all of, the detectors in the detector array. Alternatively, separate p-i-n regions could be provided for each separate semiconductor element, which may for example have electrically insulating material between semiconductor elements of different detectors in the array.

Additionally or alternatively, the charge-based element 620 of each detector 600 may be in a common charge-based layer of the substrate. Thus, the substrate may comprise a charged detector layer comprising the plurality of charge-based elements.

Additionally or alternatively, the electrically insulating element 630 between the charge-based element and the semiconductor element of each detector may be in a common electrically insulating layer of the substrate. Thus, the substrate may further comprise an electrically insulating layer between the charge-based elements and the semiconductor elements.

Additionally or alternatively, the circuitry layer 640 of each detector may be comprised in a common circuitry layer of the substrate. Thus, the substrate may comprise a circuitry layer comprising a plurality of cells comprising circuitry associated with the charge-based element and/or the semiconductor elements as for example described and depicted in FIGS. 10A, 10B and 10C. The detector may comprise one or more vias for each cell, connecting the respective charge-based element 620 and/or the respective semiconductor element 610 to the circuitry of the cell. For example, each of the charge-based elements 620 may comprise an electrically insulated via 622 as described above, which is connected from a respective one of the charge-based elements 620 to the circuitry layer 640. Each of the semiconductor elements 610 may additionally or alternatively comprise a via to connect to the detector circuitry, or the semiconductor elements may be directly connected to the detector circuitry by the upper metal layer 612.

The circuitry layer 640 may comprise a transimpedance amplifier and/or an analog-to-digital converter in each cell. Optionally, the circuitry layer may comprise a transimpedance amplifier and/or an analog-to-digital converter for each of the respective charge-based element 620 and/or the respective semiconductor element 610 of the corresponding cell. Thus, each of the charge-based element and/or the semiconductor elements may be connected to a transimpedance amplifier and/or an analog-to-digital converter associated with the respective charge-based element and/or the semiconductor elements.

The detector array may comprise a shielding element 660, as shown in FIG. 18. The shielding element 660 may be an extra metal layer. The shielding element 660 may be positioned between the charge-based element 620 and the semiconductor element 620 to avoid (or at least reduce) crosstalk effects between the two detection elements. More specifically, the shielding element 660 may be positioned between the metal layer 621 of the charge-based element 620 and the lower metal layer 613 of the semiconductor element 610. This would mean that signal particles need to travel through a thicker layer before reaching detector 610, so this shielding element 660 is preferably as thin as possible. Additionally, the electrically insulating element 630 may have portions, e.g. thin portions 630A and 630B, either side of the shielding element. The thin portions 630A, 630B may be protrusions of the electrically insulating element 630. The thin portions 630A and 630B may be provided as a thin film, or layer, or planar portion. Thus, there may an electrically insulating portion 630A between the charge-based element 620 and the shielding element 660 and an electrically insulating portion 630B between the semiconductor element 610 and the shielding element 660. Preferably, the electrically insulating portions 630A, 630B are also as thin as possible. The thin portions 630A, 630B may each have a thickness as described above in relation to the electrically insulating element 630, for example, the thickness of each portion 630A, 630B may be between approximately 10 to 500 nm. The thickness may depend on the material and may optionally be $SiO_2$ as described. The shielding element 660 could be used in any of the detectors described above, e.g. as described in relation to FIG. 14, FIG. 15 and/or FIG. 16.

The detector array may further comprise a wiring layer. The wiring may be routed between cells. Thus, the wiring layer may include the wiring routes 554 described above. The wiring layer may connect to the circuitry of a cell (e.g. relating to a single semiconductor element and a single charge-based element) away from the apertures, e.g. defined through the cell array as described above. The wiring layer may comprise shielding between wiring connecting different cells. For example, the wiring layer may comprise a shielding arrangement as shown in and described above in relation to FIG. 13. The cells may only be connected to each other via the wiring of the wiring layer. The wiring layer may be formed between and around the cells. The wiring layer and the circuitry layer may form a single layered portion together. (Within the layered portion, the wiring and circuitry may take up as many of the CMOS layers as the CMOS architecture permits), Alternatively the wiring layer and the circuitry layer may each have their own respective layered portion. The wiring layer may form a connection for a cell in between the cells of the cell array. The wiring layer may externally connect a cell so that the detection signal of a detector may be transmitted from a cell to an external connection towards a processor for processing detection signal. The circuits and wiring of each cell are generally isolated; that is the cells are electrically insulated from each other. The wiring layer connects the associated detector to a data path for transmitting detection signals from the detector array in a manner which reduces the risk of disruption to the detection signal. The wires for transporting the detection signal externally are isolated to prevent cross-talk. The wiring layer and/or the circuitry layer may form, for example separately or together, a monolithic layered portion in the substrate configured to connect to each of the detectors in the detector array.

As described above in relation to the single detectors, the charge-based element 620 may be closer to the detection surface. Thus, the charge detector layer may be closer to the detection surface of the detector array than the corresponding semiconductor element layer. Each of the charge-based elements 620 may overlap with at least part of the corresponding semiconductor element 610. In an embodiment, the overlap is substantially complete, as shown in FIG. 17. Thus, the array may be provided based on the detector as shown in FIG. 14. In another embodiment, there may only be a partial overlap. In this case, the detection surface may be provided by the charge detector layer and the semiconductor detector layer. Thus, the array may be provided based on the detector 600 as shown in FIG. 15. In another embodiment, there may be no overlap. In this case, the detection surface may be provided by the charge detector layer and the semiconductor detector layer. Thus, the array may be provided based on the detector as shown in FIG. 16.

Any of the detectors described above may be provided as part of a charged particle device for an assessment tool to detect charged particles from a sample.

The charged particle device may be a single beam device, for example as described in relation to FIG. 9, although other configurations may be used for the provision of a single beam device. The charged particle device may comprise an objective lens (e.g. of objective lens assembly 132) configured to project the primary beam of charged particles onto the sample 208. The objective lens may be configured as described above. Preferably, an aperture is defined in the objective lens for the primary beam and an aperture is defined in the substrate of the detector 600 which is aligned with the aperture in the objective lens. Although as described above, the detector 600 could be provided to the side of the primary beam, such that the detector does not have an aperture formed through the detector. In this case, the detector 600 may still be aligned with the primary beam, e.g. by being positioned in the charged particle device in close proximity to the primary beam so as to detect signal particles emitted from the sample.

The detector used in the charged particle device may be as described in any of the above embodiments and variations.

The detector used in the charged particle device may comprise a first detector element configured to detect signal particles above the first energy threshold and a second detector element configured to detect signal particles below the second energy threshold. In this instance, the detector may be proximate the sample, and may comprise a semiconductor element. Thus, two different types of detector may be provided close to the sample, wherein the detector 600 at least comprises the semiconductor element. It is beneficial that the detector is proximate the sample, because at this location, the energy differential between the lower signal particles and the higher signal particles will be greater than further up-beam (towards the source). At this position, the energy difference may be at its greatest in magnitude. In arrangement, the ratio in energy is at its greatest. This assumes that the signal particles are substantially not accelerated towards the detector. However, there may be a potential difference applied to accelerate signal particles towards the detector, which is described further below.

As described above, in general it can be expected that the effective first and second energy thresholds are different because of the energy loss in the layers between the first detector element and the second detector element.

The first detector element may be the semiconductor element described in detail above. The second detector element may be the charge-based element described in detail above.

The charged particle device may be a multi-beam device, for example as described in relation to FIGS. 3 and 8, although other configurations may be used for the provision of a multi-beam device. The charged particle device may comprise an objective lens array 241 configured to project a plurality of sub-beams of charged particles onto the sample 208 in a multi-beam array. The objective lens array 241 may be configured as described above. The charged particle device may comprise a detector array as described above, or a detector system comprising a detector array as described above. Preferably, an aperture is defined in the objective lens array for each of the sub-beams and an aperture is defined in each of the detectors of the detector array. Preferably the apertures of the at least one detector array are aligned with the apertures defined in the objective lens array 241.

The detector may be associated with the objective lens array 241. For example, the detector may be structurally connected to the objective lens array 241. Thus, the detector may be positioned on, attached, or directly connected to the objective lens. Specifically, the detector may be associated with a major surface of an electrode plate of the objective lens array 241. Thus, the detector may be structurally connected to an electrode of the objective lens array 241. The detector may be positioned adjacent to, or structurally connected to the most down-beam electrode of the objective lens array 241. The detector 600 may be positioned adjacent to, or structurally connected to, a down-beam surface of the most down-beam electrode of the objective lens array 241. The detector could be positioned adjacent to, or structurally connected to, the most up-beam electrode of the objective lens array 241. If the detector is part of the detector array, the detector array and or detector system may be associated with the objective lens array 241 as described herein.

The detector 600 may be positioned in any appropriate location in the charged particle device. The detector may provide a surface of the device. Preferably the surface of the device is configured to face the sample. Preferably the detector is proximate the sample. Preferably the detector is adjacent the sample. Preferably the detector is directly adjacent the sample and there are no other components between the detector and the sample. It is beneficial to provide the detector proximate the sample because this improves overall detection efficiency of the lower and higher energy signal particles simultaneously at the detector elements. The detector 600 could be provided up-beam of the objective lens array 241 along the path of the primary beam 320. If the detector 600 is part of the detector array, the detector array and or detector system may be positioned as described herein.

The device may be configured to apply a potential difference between the sample 208 and the detector array for example applied to at least part of the detector array, for example to at least a detector, for example to at least part of a detector such as a charge-based element and/or a semiconductor based element. The potential difference may be referred to as a bias voltage. For example, the potential may be relatively small. For example, the potential difference between the sample 208 and the detector array may be approximately 50 V-300 V. The detector array may be more positive than the sample. Thus, the potential difference may be used to attract signal particles to the detector array. Such an accelerating voltage (e.g. around 50 V-300 V) is small compared the difference in energy between lower energy signal particles (e.g. secondary signal particles with a maximum energy of approximately 50 eV) and higher energy signal particles (e.g. backscatter signal particles with a maximum energy up to the landing energy of keV's or more). It will be noted that a small potential difference will tend to have a greater effect on the lower energy particles, such as those corresponding to the secondary signal particles. Of course, the same potential may be applied to a single detector, e.g. when provided as part of a single beam device.

Any of the configurations of detector described above may have such a potential difference applied to attract signal particles which may be beneficial as described above. It is noted that the use of this potential difference is particularly beneficial for the configuration of the detector in which the charge-based element partially covers the semiconductor element as shown in FIG. 15 or provides an inner ring as in FIG. 16. In this case, the lower energy signal particles (e.g. secondary signal particles) may be accelerated upwards due to the resulting field between the sample and the detector. This may mean that the lower energy signal particles predominantly hit (or only hit) the charge-based element 621 formed as an inner ring of a concentric detector. Thus, it might be advantageous to only use the charge-based element on this inner ring because this reduces the creation of charge by larger energy signal particles (e.g. backscatter signal particles) in the charge-based element and reduces noise.

In an arrangement of detector 600 at least one of the first and second elements is a charge-based detector or a semiconducting detector. The substrate, for example of the detector 660, may comprises layers comprising the first and second elements in different layers. The detector further comprising an electrically insulating element between the charge-based element and the semiconductor element. The detector may comprise two charge detector elements that are configured to detect different signal particles and to detect simultaneously. Alternatively or additionally the detector may comprise a charge-based element and a semiconducting element and configured such that the semiconductor element and the charge-based element detect simultaneously.

In such an arrangement of detector, an aperture is defined in the substrate for the passage therethrough of a charged particle beam. The first energy threshold may corresponds to a backscatter threshold energy. The second energy threshold may correspond to a secondary threshold energy. The first energy threshold and the second energy threshold are substantially the same or have an offset. At least one charge-based element comprises a metal layer. An electrically insulated via is configured to connect the charge-based element to detector circuitry. The vias are electrical connectors. A charge-based element may be electrically connected with an electrical connector. The semiconductor elements may be electrically connected, i.e. respectively electrically connected, with an electrical connector. The charge-based element and the semiconductor element are each at least part of layers that are substantially co-planar with the major surfaces of the detector. The charge-based element and the semiconductor element are each at least part of layers that are stacked structure along the beam path. A detector array may comprise a plurality of such detectors; the detectors are comprised in a common substrate. Each detector may correspond to a respective sub-beam of a multi-beam array. The apertures in the plurality of detectors are for passage of the sub-beams. Such a detector and detector array may take the features of other embodiments of detector and detector array described herein.

In embodiment of charged particle device which may be for a multi-beam assessment system (or assessment tool) configured to detect charged particles from a sample. The device comprises an objective lens for example as herein disclosed and a detector for example as herein disclosed. The objective lens array may be configured to project a plurality of beams of charged particles onto a sample. The detector may be proximate the sample. In the detector are defined a plurality of apertures for paths of the beams towards the sample. In an embodiment the detector comprises a first detector layer and second detector layer. The first detector layer may be a first element. The second detector layer may be a second element. The first detector layer may be configured to detect signal particles above a first energy threshold, for example above a backscatter threshold energy. The second detector layer may be configured to detect signal particles below a second energy threshold for example below a secondary threshold energy. At least one of the first and second detector layers is a charge-based detector or a semiconducting detector. The second detector layer and the first detector layer are configured to detect simultaneously.

Embodiments of the present invention may also provide a method of detecting signal particles using any of the detector, detector array, or charged particle devices as described above.

In an embodiment, a method is provided of projecting a beam of charged particles onto a sample 208 so as to detect signal particles emitted from the sample 208. The method comprises projecting the beam along a primary beam path onto a surface of the sample 208. The method comprises detecting the signal particles emitted from the sample simultaneously at a semiconductor element and at a charge-based element.

In an embodiment, a method is provided of projecting a beam of charged particles onto a sample 208 so as to detect signal particles emitted from the sample 208. The method comprises projecting the beam along a primary beam path onto a surface of the sample. The method further comprises detecting the signal particles emitted from the sample at a detector, the detector being proximate the sample and comprising a semiconductor element, the detecting comprising simultaneous detection of signal particles above a first energy threshold at a first detector element and signal particles below a second energy threshold at a second detector element.

In an embodiment, a method is provided of projecting a plurality of sub-beams of charged particles onto a sample 208 so as to detect signal particles emitted from the sample 208. The method comprises projecting the sub-beams along primary sub-beam paths onto a surface of the sample 208. The method further comprises detecting the signal particles emitted from the sample at a detector array, the detector array being proximate the sample and comprising a detector comprising a semiconductor element corresponding to each sub-beam, the detector comprising a first detector element and a second detector element, the detecting comprising simultaneous detection by each detector of signal particles above a first energy threshold at the corresponding first detector element and signal particles below a second energy threshold at the second detector element.

In an embodiment, a method is provided of projecting a beam of charged particles onto a sample so as to detect signal particles emitted from the sample 208. The method comprises providing a device according to any of the above described embodiments or variations. The method further comprises projecting a beam of charged particles to the sample using the objective lens and detecting the resulting signal particles simultaneously using the semiconductor element 610 and the charge-based element 620.

In the present description, it will be understood that the charged particles/signal particles are generally intended to be electrons, or other negatively charged particles. However, contrary to the above, the charged particles/signal particles may be positively charged particles, e.g. ions. Thus, a primary ion beam may be provided. With a primary ion beam, secondary ions could be emitted from the sample that could be detected by the charge-based element 620. However, this would also generate negative charged particles, e.g. secondary electrons at the same time. So the charge accumulated with this charge-based element 620 will be a mix of positively and negatively charged particles, which would make the charged measurement unreliable. However, having either a positive or negative bias on the charge-based element 620 would make it possible to choose one of the charge polarities. Because of the much smaller range of ions than electrons in a material, backscatter ions need a much larger kinetic energy to be able to reach the semiconductor element 610. Thus, not all backscatter ions will make it to this detector component. To improve the detection of backscatter ions, the charge-based element 620 could be made thinner. In the instance that ions are used instead of negatively charged particles, then any bias referred to above would be opposite, e.g. a positive bias should be used instead of a negative one and vice versa.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

While the description and drawings are directed to an electron-optical system, it is appreciated that the embodiments are not used to limit the present disclosure to specific charged particles. References to electrons throughout the present document may therefore be more generally be considered to be references to charged particles, with the charged particles not necessarily being electrons. The charged-particle optical device may be a negative charged particle device. The charged-particle optical device may otherwise be referred to as an electron-optical device. It will be understood that an electron is a specific charged particle and can replace all instances of charged particle referred to throughout the application as appropriate. For example, the source may specifically provide electrons. The charged particle referred to throughout the specification may be specifically a negatively charged particle.

The charged particle-optical device may more specifically be defined as a charged particle-optical column. In other words, the device may be provided as a column. The column may thus comprise an objective lens array assembly as described above. The column may thus comprise a charged particle optical system as described above, for example comprising an objective lens array and optionally a detector array and/or optionally a condenser lens array.

The charged particle optical device described above comprises at least the objective lens array 240. The charged particle optical device may comprise the detector array 241. The charged particle optical device may comprise the control lens array 250. The charged particle optical device comprising the objective lens array and the detector array may thus be interchangeable with, and referred to as, the objective lens array assembly, which may optionally comprise the control lens array 250. The charged particle optical device may comprise additional components described in relation to either of FIG. 3 and/or FIG. 8. Thus, the charged particle optical device may be interchangeable with, and referred to as, a charged particle assessment tool 40 and/or a charged particle optical system if comprising the additional components in these figures.

An assessment tool according to an embodiment of the invention may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The charged particle beam tool 40 (which may be a charged particle-optical column) may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

Reference to a component or system of components or elements being controllable to manipulate a charged particle beam in a certain manner includes configuring a controller or control system or control unit to control the component to manipulate the charged particle beam in the manner described, as well as optionally using other controllers or devices (e.g. voltage supplies and/or current supplies) to control the component to manipulate the charged particle beam in this manner. For example, a voltage supply may be electrically connected to one or more components to apply potentials to the components, such as in a non-limited list including the control lens array 250, the objective lens array 241, the condenser lens 231, correctors, collimator element array 271, detector array 240n (such as one or more of the charge-based elements and/or one or more of the semiconductor elements), the stage 209 (so for example the sample 207) and scan deflector array 260; such voltage supply may be under the control of the controller or control system or control unit. The voltage supply may apply a potential difference such as a bias voltage to at least part of detector (or detector array such as the charge-based elements and/or semiconductor elements) for example relative to a sample 207. Such bias voltage may be controlled for example by control system for example controller 50. An actuatable component, such as a stage, may be controllable to actuate and thus move relative to another components such as the beam path using one or more controllers, control systems, or control units to control the actuation of the component.

The embodiments herein described may take the form of a series of aperture arrays or charged particle-optical elements arranged in arrays along a beam or a multi-beam path. Such charged particle-optical elements may be electrostatic. In an embodiment all the charged particle-optical elements, for example from a beam limiting aperture array to a last charged particle-optical element in a sub-beam path before a sample, may be electrostatic and/or may be in the form of an aperture array or a plate array. In some arrangements one or more of the charged particle-optical elements are manufactured as a microelectromechanical system (MEMS) (i.e. using MEMS manufacturing techniques).

The system or device of such architectures as depicted in at least FIGS. 3 and 8 and as described above may comprise components such as an upper beam limiter, a collimator element array 271, a control lens array 250, a scan deflector array 260, an objective lens array 241, a beam shaping limiter and/or a detector array 240; one or more of these elements that are present may be connected to one more adjacent elements with an isolating element such as a ceramic or glass spacer.

A computer program may comprise instructions to instruct the controller 50 to perform the following steps. The controller 50 controls the charged particle beam apparatus to project a charged particle beam towards the sample 208. In an embodiment the controller 50 controls at least one charged particle-optical element (e.g. an array of multiple deflectors or scan deflectors 260, 265) to operate on the charged particle beam in the charged particle beam path. Additionally or alternatively, in an embodiment the controller 50 controls at least one charged particle-optical element (e.g. the detector array 240) to operate on the charged particle beam emitted from the sample 208 in response to the charged particle beam.

Any element or collection of elements may be replaceable or field replaceable within the charged particle beam tool 40. The one or more charged particle-optical components in the charged particle beam tool 40, especially those that operate on sub-beams or generate sub-beams, such as aperture arrays and manipulator arrays may comprise one or more MEMS.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims and clauses.

There are provided the following clauses:

Clause 1: A detector for use in a charged particle device for an assessment tool to detect signal particles from a sample, the detector comprising or comprised in a substrate, the substrate comprising: a semiconductor element configured to detect signal particles, e.g. from a sample, above a first energy threshold; and a charge-based element configured to detect signal particles, e.g. from the sample, below a second energy threshold, desirably the charged particle device configured to project a beam of charged particles to the sample, desirably the detector configured to detect the resulting signal particles, desirably the resulting signal particles comprising the signal particles above the first energy threshold and desirably the resulting signal particles comprising the signal particles below the second energy threshold, and desirably an electrical connector, for example a via, may be configured to electrically connect the semiconductor element and/or the charge-based element for example to so as to apply a potential difference to at least part of the detector for example the charge-based element and/or a semiconductor based element, the potential different may be a biasing voltage Clause 2: The detector of clause 1, wherein an aperture is defined in the substrate for the passage therethrough of a charged particle beam (or of the respective charged particle sub-beams).

Clause 3: The detector of clause 1 or clause 2, further comprising an electrically insulating element between the charge-based element and the semiconductor element.

Clause 4: The detector of any of clauses 1 to 3, wherein the first energy threshold corresponds to a backscatter threshold energy.

Clause 5: The detector of any preceding clause, wherein the second energy threshold corresponds to a secondary threshold energy.

Clause 6: The detector of any preceding clause, wherein the first energy threshold and the second energy threshold are substantially the same or have an offset.

Clause 7: The detector of any of the preceding clauses, wherein the charge-based element comprises a metal layer.

Clause 8: The detector of any of the preceding clauses, further comprising an electrically insulated via configured to connect the charge-based element to detector circuitry, preferably the substrate comprises a circuitry layer comprising the detector circuitry.

Clause 9: The detector of clause 8, wherein the electrically insulated via extends through at least part of the semiconductor element.

Clause 10: The detector of any of the preceding clauses, wherein the semiconductor element comprises an upper metal layer and a lower metal layer on either side of a p-i-n region.

Clause 11: The detector of clause 10, wherein the lower metal layer is also part of the charge-based element.

Clause 12: The detector of clause 10 or clause 11, wherein the upper metal contact is connected to detector circuitry that is preferably comprised in a circuitry layer in the substrate.

Clause 13: The detector of any of the preceding clauses, wherein the charge-based element and the semiconductor element are each at least part of layers that are substantially co-planar with the major surfaces of the detector and the layers are comprised in a stacked structure comprised in the detector stacked in a thickness direction of the detector.

Clause 14: The detector of any of the preceding clauses, wherein the charge-based detector element forms a layer over substantially the whole semiconductor element.

Clause 15: The detector of any of the preceding clauses, wherein the charge-based element is closer to a detector surface (or an individual detector surface) than the semiconductor element, preferably the charge-based element provides at least part of the detector surface (or the individual detector surface).

Clause 16: The detector of any of clauses 1 to 12, wherein the charge-based element and the semiconductor element are positioned adjacent to each other in cross-section, preferably the charge-based element provides at least part of the detector surface (or the individual detector surface) and the semiconductor element provides at least part of the detector surface (or the individual detector surface).

Clause 17: The detector of clause 16, wherein the charge-based element and the semiconductor element each comprise an annulus which are preferably concentric and radially divided from each other.

Clause 18: The detector of clause 16 or 17, wherein the charge-based element and the semiconductor element each comprise sectors which are preferably angularly divided.

Clause 19: The detector of any preceding clause, wherein the charge-based element has a thickness of approximately 100 nm or less, preferably approximately 10 nm to 100 nm.

Clause 20: The detector of any preceding clause, wherein the charge-based element is connected to a transimpedance amplifier preferably in a circuitry layer and/or the semiconductor element is connected to a transimpedance amplifier preferably in a circuitry layer and/or further comprising a shielding layer 660 positioned between the charge-based element and the semiconductor element, preferably with electrically insulating portions between the charge-based element and the shielding layer and between the semiconductor element and the shielding layer.

Clause 21: A detector for use in a charged particle device, the detector comprising a substrate, the substrate comprising: a first element configured to detect signal particles above a first energy threshold; and a second element configured to detect signal particles below a second energy threshold, wherein at least one of the first and second elements is a charge-based detector or a semiconducting detector Clause 22: The detector of clause 21, wherein the substrate comprises layers comprising the first and second elements in different layers and/or the detector further comprises an electrically insulating element between the charge-based element and the semiconductor element.

Clause 23: The detector of clause 21 or 22, wherein the detector comprises two charge detector elements that are configured to detect different signal particles and to detect simultaneously Clause 24: The detector of any of clauses 21 to 23, wherein the detector comprises a charge-based element and a semiconducting element and configured such that the semiconductor element and the charge-based element detect simultaneously.

Clause 25: The detector of clauses 21 to 24, wherein an aperture is defined in the substrate for the passage therethrough of a charged particle beam.

Clause 26: The detector of any of clauses 21 to 25 wherein the first energy threshold corresponds to a backscatter threshold energy.

Clause 27: The detector of any of clauses 21 to 26 wherein the second energy threshold corresponds to a secondary threshold energy.

Clause 28: The detector of any of clauses 21 to 27, wherein the first energy threshold and the second energy threshold are substantially the same or have an offset.

Clause 29: The detector of any of clauses 21 to 28, wherein at least one of the charge-based element comprises a metal layer.

Clause 30: The detector of any of clauses 21 to 29, further comprising an electrically insulated via configured to connect the charge-based element to detector circuitry, Clause 31: The detector of any of clauses 21 to 30, wherein the charge-based element and the semiconductor element are each at least part of layers that are substantially co-planar with the major surfaces of the detector and are stacked structure along the beam path.

Clause 32: The detector of any of clauses 21 to 31, wherein the detectors are comprised in a common substrate, each detector corresponding to a respective sub-beam of a multi-beam array, the apertures of the plurality of detectors are for passage of the sub-beams Clause 33: A detector array comprising a plurality of detectors according to any preceding clause, wherein the detectors are comprised in a common substrate, each detector corresponding to a respective sub-beam, preferably: a) the semiconductor element of each detector is in a common semiconductor layer of the substrate; b) the charge-based element of each detector is in a common charge-based layer of the substrate; c) the circuitry layer of each detector is comprised in a common circuitry layer of the substrate; d) the electrically insulating element between the charge-based element and the semiconductor element of each detector is in a common electrically insulating layer of the substrate; e) the detectors being arranged in an array corresponding in arrangement to the array of sub-beams of the multi-beam array, wherein the arrangement may be a hexagonal or rectilinear grid; and/or f) apertures of the plurality of detectors are for passage of sub-beams of a multi-beam array.

Clause 34: A detector array for use in a multi-beam charged particle device for an assessment tool to detect signal particles from a sample, the detector array comprising at least one substrate in which is defined an plurality of apertures for the passage therethrough of the plurality of sub-beams of charged particle beams towards a sample, the substrate comprising: a plurality of semiconductor elements configured to detect signal particles above a first energy threshold; and a plurality of charge-based elements configured to detect signal particles below a second energy threshold, wherein each semiconductor element is associated with a corresponding one of the charge-based elements.

Clause 35: The detector array of clause 34, wherein the substrate comprises a semiconductor detector layer comprising the plurality of semiconductor elements.

Clause 36: The detector array of clause 34 or 35, wherein the substrate comprises a charged detector layer comprising the plurality of charge-based elements.

Clause 37: The detector array of clause 36, wherein the charge-based element comprises a metal layer.

Clause 38: The detector array of clause 36 or 37, wherein the charge detector layer is closer to a detection surface of the detector array than the corresponding semiconductor element, the detection surface being the surface of the detector array for passage of the signal particles to the semiconductor element or the charge-based element.

Clause 39: The detector array of any of clauses 36 to 38, wherein each of the charge-based elements overlaps with at least part of the corresponding semiconductor element, preferably the overlap is substantially complete.

Clause 40: The detector array of any of the clauses 36 to 38, wherein charge-based element and the semiconductor element are positioned adjacent to each other, e.g. in cross-section.

Clause 41: The detector of any of the preceding clauses, the substrate further comprising an electrically insulating element between the charge-based elements and the semiconductor elements.

Clause 42: The detector array of any of the preceding clauses, the substrate further comprising a circuitry layer comprising a plurality of cells comprising circuitry associated with the charge-based element and/or the semiconductor elements.

Clause 43: The detector array of clause 42, further comprising one or more vias for each cell, connecting the respective charge-based element and/or the respective semiconductor element to the circuitry of the cell.

Clause 44: The detector array of clause 43, wherein the circuitry layer comprises a transimpedance amplifier and/or an analog-to-digital converter in each cell, optionally for each of the respective charge-based element and/or the respective semiconductor element of the corresponding cell.

Clause 45: The detector array of clause 44, further comprising a wiring layer, wherein the wiring layer comprises wiring that connects the circuitry of the cell away from the plurality of apertures Clause 46: The detector array of clause 45, wherein the wiring is routed between cells.

Clause 47: The detector array of either clause 45 or 46, wherein the wiring comprises shielding between wiring connecting different cells.

Clause 48: A charged particle device for a multi-beam assessment system to detect charged particles from a sample, the device comprising: an objective lens array configured to project a plurality of beams of charged particles onto a sample; and a detector proximate the sample and in which are defined a plurality of apertures for paths of the beams towards the sample, the detector comprising: a first detector layer for detecting signal particles above a first energy threshold and a second detector layer for detecting signal particles below a second energy threshold wherein at least one of the first and second detector layers is a charge-based detector or a semiconducting detector and/or the second detector layer and the first detector layer are configured to detect simultaneously Clause 49: A charged particle device for an assessment tool to detect signal particles from a sample, the device comprising: an objective lens configured to project a beam of charged particles onto a sample; and a detector of any of the clauses 1 to 32.

Clause 50: The charged particle device of clause 49, wherein an aperture is defined in the objective lens for the beam and an aperture is defined in the substrate of the detector which is aligned with the aperture in the objective lens.

Clause 51: A charged particle device for an assessment tool to detect signal particles from a sample, the device comprising: an objective lens array configured to project a plurality of sub-beams of charged particles onto a sample in a multi-beam array, and in which an aperture is defined for each sub-beam; and a detector system comprising at least one detector array of any of clauses 19 to 47, wherein the apertures of the at least one detector array are aligned with the apertures defined in the objective lens array.

Clause 52: The charged particle device of clause 51, wherein at least one detector of the detector system is structurally connected to the objective lens.

Clause 53: The charged particle device of clause 51 or 52, wherein at least one detector is associated with a major surface of an electrode plate of the objective lens.

Clause 54: The charged particle device of any of clauses 49 to 53, wherein at least one detector provides a surface of the device, preferably configured to face a sample and/or such that the detector (or the at least one detector) is proximate the sample.

Clause 55: The charged particle device of any of clauses 49 to 54, wherein at least one detector is provided up beam along the path of the plurality of sub-beams of the objective lens.

Clause 56: A charged particle device for an assessment tool to detect charged particles from a sample, the device comprising: an objective lens configured to project a beam of charged particles onto a sample, and in which an aperture is defined for the beam; and a detector proximate the sample and defining an aperture aligned with the aperture of the objective lens, the detector comprising a first detector element configured to detect signal particles above a first energy threshold and a second detector element configured to detect signal particles below a second energy threshold simultaneously, wherein the detector comprises a semiconductor element.

Clause 57: The charged particle device of clause 56, wherein the first detector element comprises the semiconductor element.

Clause 58: The charged particle device of either of clauses 56 or 57, wherein the second detector element comprises a charge-based detector element.

Clause 59: The charged particle device of clause 58, wherein the detector is according to any of clauses 1 to 32.

Clause 60: The charged particle device of any of clauses 49 to 59, the device being configured to apply a potential difference between the sample and the detector.

Clause 61: The charged particle device of clause 60, wherein the potential difference between the sample and the detector is approximately 50 V-300 V.

Clause 62: The charged particle device of either of clauses 60 or 61, wherein the detector is more positive than the sample.

Clause 63: The charged particle device of any of clause 48 to 62 further comprising a voltage supply configured to be electrically connected to one or more components to apply potentials to the components, desirably further comprising a controller configured to control the voltage supply Clause 64: The charged particle device of clause 63, wherein the voltage supply is configured to apply a bias voltage to at least part of the detector (or the detector array), desirably the detector for example between the detector (or detector array) and the sample.

Clause 65: A charged particle assessment tool comprising the charged particle device of any of clause 48 to 64, desirably the charged particle assessment tool is for assessing by detecting signal particles from a sample using a charged particle device for projecting a multi-beam of charged particles towards a sample Clause 66: The assessment tool of clause 65 comprising a stage configured to support a sample, desirably the stage comprising a sample holder configured to hold a sample.

Clause 67: A method of projecting a beam of charged particles onto a sample so as to detect signal particles emitted from the sample, the method comprising: a) projecting the beam along a primary beam path onto a surface of the sample; and b) detecting the signal particles emitted from the sample simultaneously at a semiconductor element and at a charge-based element.

Clause 68: A method of projecting a beam of charged particles onto a sample so as to detect signal particles emitted from the sample, the method comprising: a) projecting the beam along a primary beam path onto a surface of the sample; and b) detecting the signal particles emitted from the sample at a detector, the detector being proximate the sample and comprising a semiconductor element, the detecting comprising simultaneous detection of signal particles above a first energy threshold at a first detector element and signal particles below a second energy threshold at a second detector element.

Clause 69: A method of projecting a plurality of sub-beams of charged particles onto a sample so as to detect signal particles emitted from the sample, the method comprising: a) projecting the sub-beams along primary sub-beam paths onto a surface of the sample; and b) detecting the signal particles emitted from the sample at a detector array, the detector array being proximate the sample and comprising a detector comprising a semiconductor element corresponding to each sub-beam, the detector comprising a first detector element and a second detector element, the detecting comprising simultaneous detection by each detector of signal particles above a first energy threshold at the corresponding first detector element and signal particles below a second energy threshold at the second detector element.

Clause 70: A method of projecting a beam of charged particles onto a sample so as to detect signal particles emitted from the sample, the method comprising: providing a device according to any of clauses 48 to 53; projecting a beam of charged particles to the sample using the objective lens; detecting the resulting signal particles simultaneously using the semiconductor element and the charge-based element.

The invention claimed is:

1. A detector for use in a charged particle device for an assessment tool, the charged particle device configured to project a beam of charged particles to a sample and the detector to detect resulting signal particles from the sample, the detector comprising a substrate, the substrate comprising:
   a semiconductor element configured to detect signal particles above a first energy threshold; and
   a charge-based element configured to detect signal particles below a second energy threshold,
   wherein the charge-based element and the semiconductor element are each at least part of layers that are substantially co-planar with major surfaces of the detector and the layers are comprised in a stacked structure comprised in the detector stacked in a thickness direction of the detector, and
   wherein the charge-based element is connected by a first electrical connection to detection circuitry and the semiconductor element is connected by a second electrical connection to detection circuitry, the first electrical connection being separate from the second electrical connection.

2. The detector of claim 1, wherein an aperture is defined in the substrate for the passage therethrough of a charged particle beam.

3. The detector of claim 1, further comprising an electrically insulating element between the charge-based element and the semiconductor element.

4. The detector of claim 1, wherein the first energy threshold corresponds to a backscatter threshold energy.

5. The detector of claim 1, wherein the second energy threshold corresponds to a secondary threshold energy.

6. The detector of claim 1, wherein the first energy threshold and the second energy threshold are substantially the same or have an offset.

7. The detector of claim 1, wherein the charge-based element comprises a metal layer.

8. The detector of claim 1, wherein the first electrical connection comprises an electrically insulated via configured to connect the charge-based element to detector circuitry.

9. The detector of claim 8, wherein the electrically insulated via extends through at least part of the semiconductor element.

10. The detector of claim 1, wherein the semiconductor element comprises an upper metal layer and a lower metal layer on either side of a p-i-n region.

11. The detector of claim 10, wherein the lower metal layer is also part of the charge-based element, and/or wherein the upper metal layer is connected to detector circuitry.

12. The detector of claim 1, wherein the charge-based element forms a layer over substantially the whole semiconductor element.

13. The detector of claim 1, wherein the charge-based element is closer to a detector surface than the semiconductor element.

14. The detector of claim 1, wherein the charge-based element and the semiconductor element are positioned adjacent to each other in cross-section.

15. The detector of claim 14, wherein the charge-based element and the semiconductor element each comprise an annulus and radially divided from each other and/or wherein the charge-based element and the semiconductor element each comprise sectors.

16. A detector for use in a charged particle device for an assessment tool, the charged particle device configured to project a beam of charged particles to a sample and the detector to detect resulting signal particles from the sample, the detector comprising a substrate, the substrate comprising:

a semiconductor element configured to detect signal particles above a first energy threshold;
a charge-based element configured to detect signal particles below a second energy threshold; and
an electrically insulated via configured to connect the charge-based element to detector circuitry, wherein the electrically insulated via extends through at least part of the semiconductor element.

17. The detector of claim 16, wherein the substrate comprises a circuitry layer comprising the detector circuitry.

18. The detector of claim 16, wherein the semiconductor element comprises an upper metal layer and a lower metal layer on either side of a p-i-n region.

19. The detector of claim 18, wherein the lower metal layer is also part of the charge-based element and/or wherein the upper metal layer is connected to detector circuitry.

20. A method of projecting a beam of charged particles onto a sample so as to detect resulting signal particles emitted from the sample, the method comprising:

projecting the beam along a primary beam path onto a surface of the sample; and
detecting the resulting signal particles emitted from the sample at a detector, the detector being proximate the sample and comprising a semiconductor element, the detecting comprising simultaneous detection of signal particles above a first energy threshold at a first detector element and signal particles below a second energy threshold at a second detector element,
wherein the first and second detector elements are comprised in a stacked structure comprised in the detector and are stacked in a thickness direction of the detector, the thickness being the smallest of the three dimensions of the detector, and
wherein the first detector is connected by a first electrical connection to detection circuitry and the second detector element is connected by a second electrical connection to detection circuitry, the first electrical connection being separate from the second electrical connection.

* * * * *